(12) United States Patent
Kato

(10) Patent No.: US 7,101,630 B2
(45) Date of Patent: Sep. 5, 2006

(54) DIARYLAMINO GROUP-CONTAINING COPOLYMER, ORGANIC ELECTROLUMINESCENT DEVICE, AND METHOD OF PRODUCING HOLE TRANSPORT LAYER FOR ORGANIC ELECTROLUMINESCENT DEVICE

(75) Inventor: Shinji Kato, Sakura (JP)

(73) Assignee: Kawamura Institute of Chemical Research, Sakura (JP)

( * ) Notice: Subject to any disclaimer, the term of this patent is extended or adjusted under 35 U.S.C. 154(b) by 234 days.

(21) Appl. No.: 10/615,775

(22) Filed: Jul. 10, 2003

(65) Prior Publication Data

US 2005/0008893 A1    Jan. 13, 2005

(51) Int. Cl.
*H05B 33/12*    (2006.01)
*C08F 212/32*   (2006.01)
*H01L 27/32*    (2006.01)
*H01L 51/50*    (2006.01)

(52) U.S. Cl. ............... 428/690; 428/917; 313/504; 313/506; 427/66; 526/271; 526/310; 252/301.16

(58) Field of Classification Search ............... 428/690, 428/917; 313/504, 506; 427/66; 526/271, 526/310; 252/301.16
See application file for complete search history.

(56) References Cited

U.S. PATENT DOCUMENTS 4,322,487 A * 3/1982 Merrill et al. ............ 430/37
4,356,429 A   10/1982 Tang

FOREIGN PATENT DOCUMENTS

| JP | 9-255725    | 9/1997  |   |
|----|-------------|---------|---|
| JP | 9-255774    | 9/1997  |   |
| JP | 2002-370310 | 12/2002 |   |
| JP | 2003-142272 | *       | 5/2003 |

OTHER PUBLICATIONS

C.W. Tang, et al., Applied Physics Letters, 1987, 51(12), pp. 913-915, published on Sep. 21,1987.
Junji Kido, Trends in Polymer Science (TRIP), 1994, vol. 2, No. 10, pp. 350-355, published in Oct. 1994.
Erika Bellmann et al., Chemistry of Materials, 1999, vol. 11, pp. 399-407, published on Jan. 21, 1999.

* cited by examiner

*Primary Examiner*—Dawn L. Garrett
(74) *Attorney, Agent, or Firm*—Armstrong, Kratz, Quintos, Hanson & Brooks, LLP

(57) ABSTRACT

An organic electroluminescent device is provided which has a high degree of adhesion between an anode and a hole transport layer, the device emitting light of high luminance even when driven by low applied voltages. Copolymers useful in hole transport layers in organic electroluminescent devices are also provided. Methods of producing hole transport layers for organic electroluminescent devices which can emit light of high luminance even when driven by low applied voltages are also provided, the hole transport layers having high degrees of adhesion with anode. A copolymer comprises a monomer unit including in its structure an electron-donating N,N-diaryl-substituted amino group such as an N,N-diphenylaminophenyl group, or a group having an N,N-diaryl-substituted amino moiety, and a monomer unit having at least one functional group. Also, a hole transport layer, which has excellent thickness accuracy, has an extremely smooth surface, and is very thin, can be formed of this copolymer or a copolymer having the same hole transport functional group. An organic electroluminescent device, which emits light of high luminance even when driven by low applied voltages, can be obtained by using this hole transport layer.

21 Claims, No Drawings

DIARYLAMINO GROUP-CONTAINING COPOLYMER, ORGANIC ELECTROLUMINESCENT DEVICE, AND METHOD OF PRODUCING HOLE TRANSPORT LAYER FOR ORGANIC ELECTROLUMINESCENT DEVICE

BACKGROUND OF THE INVENTION

1. Field of the Invention

The present invention relates to copolymers. The present invention also relates to organic electroluminescent devices, which are employed in the field of display devices or the like, and in which a copolymer useful in hole transport layers is used. Furthermore, the present invention relates to a method of producing hole transport layers for organic electroluminescent devices.

2. Description of Related Art

Organic electroluminescent devices are spontaneous light-emitting devices which convert excitation energy, which is generated when holes and electrons injected from an anode and a cathode, respectively, travel in an organic layer and are recombined in an organic fluorescent material, into emission energy. This type of spontaneous light-emitting device is of major interest for large area display devices driven by low voltages.

A device structure which is layered with organic layers having different carrier transport properties effectively enhances the efficiency of organic electroluminescent devices and, for example, it has been reported that a device comprising a hole transport layer made of a low-molecular-weight aromatic amine and an electron-transporting emitter layer made of an aluminum chelete complex, which are formed by a vacuum deposition method, has sufficiently high luminance of 1000 cd/m$^2$ suitable for practical use with an applied voltage of 10 V or less (see, for example, "Applied Physics Letters", 1987, Vol. 51, p. 913, and U.S. Pat. No. 4,356,429). Subsequently, extensive reseach has been performed on this type of multi-layered organic electroluminescent device.

However, as research progressed, various problems in multi-layered organic electroluminescent devices became apparent. While there has been much research on the effects of hole transport layers on characteristics of electroluminescent devices, it has been pointed out that there are problems with organic electroluminescent devices using a low-molecular-weight hole transport material in that the devices are degraded by heat generated during current injection as well as by crystallization or agglomeration in organic layers over time, and in that the emission efficiency is reduced due to formation of exciplexes when mutual diffusion occurs at the interface between a hole transport layer and an emitter layer. These problems were solved by using a hole transport layer made of a high-molecular-weight hole transport material (see, for example, "Trends in Polymer Science", 1994, Vol. 2, p. 350, and Japanese Unexamined Patent Application, First Publication No. Hei 9-255774).

However, since a conventional high-molecular-weight hole transport material does not have reactive functional groups and cannot form chemical bonds in the direction in which the layers are laminated, it is impossible to enhance adhesion of the hole transport layer with another layer, particularly with an anode surface, and it is impossible to achieve light emission having high luminance with low applied voltages. Even if an excellent hole transport material were available, the hole transport material would not be usable if the solubility of the material in a solvent used to form the hole transport layer and the solubility of the material in a solvent used to form another organic layer are the same.

BRIEF SUMMARY OF THE INVENTION

An object of the present invention is to provide an organic electroluminescent device having a high degree of adhesion between an anode and a hole transport layer, the device emitting light of high luminance even when driven by low applied voltages. Another object of the present invention is to provide copolymers useful in hole transport layers in organic electroluminescent devices. Yet another object of the present invention is to provide methods of producing hole transport layers for organic electroluminescent devices which can emit light of high luminance even when driven by low applied voltages, the hole transport layers having high degrees of adhesion with anodes.

To achieve the objects described above, the present inventors have performed extensive research and have discovered copolymers comprising a monomer unit including in its structure an electron-donating N,N-diaryl-substituted amino group such as an N,N-diphenylaminophenyl group, or a group having an N,N-diaryl-substituted amino moiety, and a monomer unit having at least one functional group. The present inventors have also discovered that the use of these copolymers or copolymers having the same hole transport functional groups makes it possible to fix the copolymer on an anode surface by covalent bonds formed by reaction of the copolymer with a coupling agent having a functional group capable of forming covalent bonds with the copolymer, and that at least one layer of the copolymer and at least one layer of a compound having two or more functional groups per molecule which are capable of forming covalent bonds with a functional group of the copolymer can be alternately laminated via covalent bonds which are newly formed by a reaction, and thus a hole transport layer, which has excellent thickness accuracy, has an extremely smooth surface, and is very thin, can be formed. Furthermore, the present inventors have discovered that organic electroluminescent devices, which emit light of high luminance even when driven by low applied voltages, can be obtained by using these hole transport layers.

The present invention provides a diarylamino group-containing copolymer comprising a molecular chain represented by the formula (1):

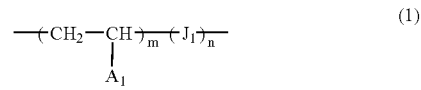

and molecular chain terminals which are each independently a radical polymerization initiator residue or a hydrogen atom, the copolymer having a degree of polymerization of 3 to 500, wherein, in the formula (1), $A_1$ represents a group represented by the formula (2) or (3):

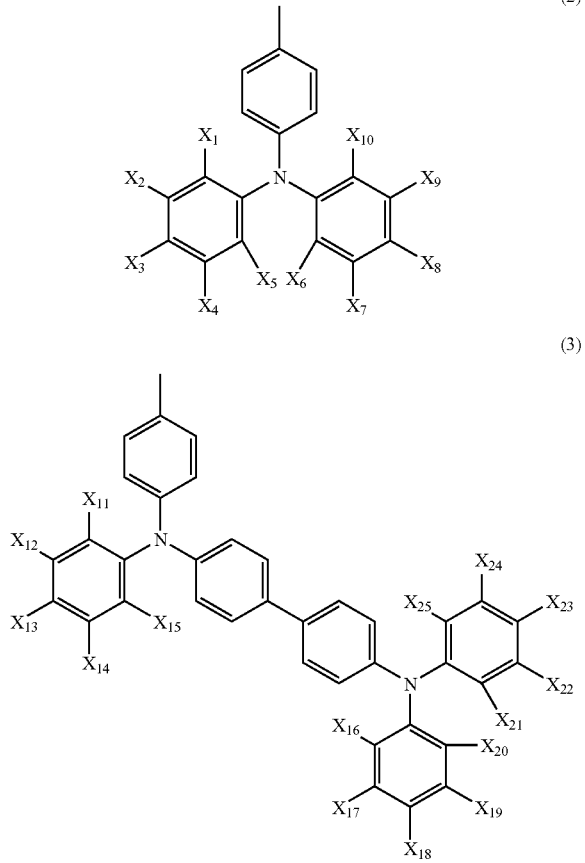
(2)

(3)

and in the formulas (2) and (3), $X_1$ to $X_{25}$ each independently represents a hydrogen atom, a halogen atom, a $C_1$ to $C_{22}$ alkyl group, a $C_1$ to $C_{22}$ alkylthio group, a $C_1$ to $C_{22}$ alkoxy group which may be substituted with a halogen atom, an N,N-dialkylamino group in which each alkyl group is a $C_1$ to $C_{22}$ alkyl group, a phenyl group, or an N,N-diphenylamino group, $J_1$ represents a repeating unit represented by any of the formulas (4) to (7):

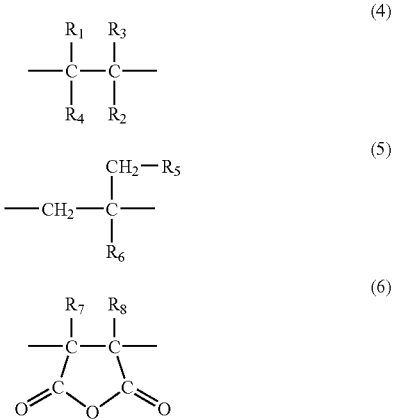
(4)

(5)

(6)

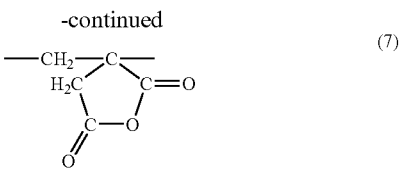
(7)

and in the formulas (4) to (7), $R_1$ to R6 each independently represents a hydrogen atom, a $C_1$ to $C_4$ alkyl group, a carboxyl group, or an alkyloxycarbonyl group in which the alkyl group is a $C_1$ to $C_{22}$ alkyl group, $R_7$ and $R_8$ each independently represents a hydrogen atom or a $C_1$ to $C_4$ alkyl group, with the proviso that at least two of $R_1$ to $R_4$ represent a carboxyl group and at least one of $R_5$ and $R_6$ represents a carboxyl group, and m and n represent positive numbers, and preferably m:n is from 1:1 to 4:1.

In addition, the present invention provides an organic electroluminescent device comprising an anode, a hole transport layer, an emitter layer and a cathode, which are provided on a transparent support, wherein the hole transport layer comprises a layer made of a copolymer represented by following formula (8):

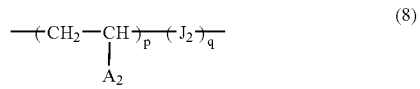
(8)

and in the formula (8), $A_2$ represents an N,N-diaryl-substituted amino group or a group having an N,N-diaryl-substituted amino moiety, $J_2$ represents a polymerizable unsaturated monomer unit having at least one functional group, and p and q represent positive numbers.

Furthermore, the present invention provides a method of producing a hole transport layer for an organic electroluminescent device which has an anode, a hole transport layer, an emitter layer and a cathode, which are provided on a transparent support, the method comprising the steps of: (I) bringing a solution containing a coupling agent having a functional group capable of forming covalent bonds with a functional group of the copolymer represented by the formula (8) into contact with the surface of the anode provided on the transparent support to form a layer made of the coupling agent, and (II) bringing a solution containing the copolymer represented by the formula (8) into contact with the surface of the layer made of the coupling agent to form a layer made of the copolymer.

Furthermore, the present invention provides a method of producing a hole transport layer for an organic electroluminescent device which has an anode, a hole transport layer, an emitter layer and a cathode, which are provided on a transparent support, the method comprising the steps of: (i) bringing a solution containing a coupling agent having a functional group capable of forming covalent bonds with a functional group of the copolymer represented by the formula (8) into contact with the surface of the anode provided on the transparent support to form a layer made of the coupling agent, (ii) bringing a solution containing the copolymer represented by the formula (8) into contact with the surface of the layer made of the coupling agent to form a layer made of the copolymer, (iii) bringing a solution containing a compound having two or more functional groups capable of forming covalent bonds with a functional group of the copolymer represented by the formula (8) into contact with the surface of the layer made of the copolymer to form a layer made of the compound, and (iv) laminating at least one layer made of the copolymer represented by the formula (8) and at least one layer made of a compound having two or more functional groups capable of forming covalent bonds with a functional group of the copolymer, in this order, after the step (iii).

In the organic electroluminescent device of the present invention, a a hole transport layer is formed using a copolymer comprising a polymerizable unsaturated monomer unit including in its structure an electron-donating N,N-diaryl-substituted amino group or a group having an N,N-diaryl-substituted amino moiety, and a polymerizable unsaturated monomer unit having at least one functional group. Therefore, it is possible to bond the hole transport layer with the anode surface by a chemical bond through a coupling agent having a group capable of forming covalent bonds with the copolymer. Thus, a hole transport layer, which has excellent thickness accuracy, has an extremely smooth surface, and is very thin, can be formed, and high emission luminance can be realized even when the device is driven by low applied voltages by using the hole transport layer.

When using, as the copolymer, a diarylamino group-containing copolymer represented by the formula (1), the diarylamino group-containing copolymer can be bonded with an amino group-containing coupling agent on the anode surface through an amide bond or an imide bond, and thus a hole transport layer, which has excellent thickness accuracy, has an extremely smooth surface, and also has a film thickness of about 1 to 100 nm, can be easily formed. Therefore, the hole transport layer using the diarylamino group-containing copolymer has excellent adhesion with the anode, and is also thin, and has excellent hole transport properties, and the organic electroluminescent device comprising the hole transport layer of the present invention can emit light having high luminance even when the device is driven by low applied voltages.

The hole transport layer made of the diarylamino group-containing copolymer is excellent in solvent resistance because it is bonded with the amino group-containing coupling agent on the anode surface, or a compound having two or more amino groups per molecule through an amide bond or an imide bond. Therefore, when forming the other organic layer constituting the organic electroluminescent device, for example, an emitter layer using a wet film formation method, various solvents may be used.

In the method of producing a hole transport layer made of a diarylamino group-containing copolymer for an organic electroluminescent device of the present invention, the step of heating after each or all of the steps for forming the layer increases the proportion of amide bonds or imide bonds between a layer made of the diarylamino group-containing copolymer of the present invention and a layer made of an amino group-containing coupling agent on the anode surface, and that between a layer made of the diarylamino group-containing copolymer and a layer made of a compound having two or more amino groups per molecule, thereby making it possible to improve adhesion between the anode and the hole transport layer and adhesion between the respective layers constituting the hole transport layer.

DETAILED DESCRIPTION OF THE INVENTION

The embodiments of the present invention will now be described in detail.

First, the diarylamino group-containing copolymer of the present invention and the method of producing the diarylamino group-containing copolymer will be described.

The diarylamino group-containing copolymer of the present invention is a copolymer represented by the formula (1) wherein $A_1$ represents a group represented by the formula (2) or (3), $J_1$ represents a repeating unit represented by the formula (4), (5), (6) or (7), and m and n represent positive numbers, preferably m:n is from 1:1 to 4:1, and molecular chain terminals are each independently a radical polymerization initiator residue or a hydrogen atom, and the degree of polymerization is from 3 to 500 (this copolymer is hereinafter occasionally abbreviated to a diarylamino group-containing copolymer (a)). The diarylamino group-containing copolymer (a) can be preferably used as a material for the hole transport layers for organic electroluminescent devices. In particular, a diarylamino group-containing copolymer (a) having a degree of polymerization within a range of 10 to 200 can be more preferably used.

In the formulas (2) and (3), $X_1$ to $X_{25}$ each independently represents a hydrogen atom, a halogen atom, a $C_1$ to $C_{22}$ alkyl group, a $C_1$ to $C_{22}$ alkylthio group, a $C_1$ to $C_{22}$ alkoxy group which may be substituted with a halogen atom, an N,N-dialkylamino group in which each alkyl group is a $C_1$ to $C_{22}$ alkyl group, a phenyl group, or an N,N-diphenylamino group.

Examples of the halogen atom represented by $X_1$ to $X_{25}$ include fluorine atom, chlorine atom, bromine atom and iodine atom. Examples of the alkyl group represented by $X_1$ to $X_{25}$ include $C_1$ to $C_{22}$, preferably $C_1$ to $C_4$ alkyl groups, such as methyl group, ethyl group, propyl group, sec-propyl group, butyl group, sec-butyl group, tert-butyl group, pentyl group, hexyl group, heptyl group, octyl group, nonyl group, decyl group, undecyl group, dodecyl group, tetradecyl group, hexadecyl group, octadecyl group and 2-ethylhexyl group.

Examples of the alkylthio group represented by $X_1$ to $X_{25}$ include $C_1$ to $C_{22}$, preferably $C_1$ to $C_4$ alkylthio groups, such as methylthio group, ethylthio group, propylthio group, butylthio group, sec-butylthio group, tert-butylthio group, hexylthio group, octylthio group, decylthio group, dodecylthio group and octadecylthio group.

Examples of the alkoxy group which may be substituted with the halogen atom represented by $X_1$ to $X_{25}$ include $C_1$ to $C_{22}$, preferably $C_1$ to $C_4$ alkoxy groups, such as methoxy group, ethoxy group, propoxy group, sec-propoxy group, butoxy group, sec-butoxy group, tert-butoxy group, pentyloxy group, hexyloxy group, octyloxy group, decyloxy group, dodecyloxy group, octadecyloxy group, trifluoromethoxy group, or trichloromethoxy group.

Examples of the dialkylamino group represented by $X_1$ to $X_{25}$ include dialkylamino groups in which each alkyl group is a $C_1$ to $C_{22}$, preferably $C_1$ to $C_4$ alkyl group, such as dimethylamino group, diethylamino group, dipropylamino group, dibutylamino group and dihexylamino group.

The phenyl group and the diphenylamino group represented by $X_1$ to $X_{25}$ may have the halogen, the alkyl group or the alkoxy group as a substituent. When the copolymer is used as a material for a hole transport layer for an organic electroluminescent device, although $X_1$ to $X_{25}$ are selected from the above specific examples without conditions, it is particularly preferable that each independently represent hydrogen, fluorine, a methyl group or a methoxy group.

Preferably, at least one of $X_1$ to $X_5$ independently represents an atom or an atomic group other than hydrogen atom, that is, a substituent. The bonding position of the substituent is not specifically limited. However, in view of ease of synthesis, it is preferable that one meta position be occupied by a substituent, or two positions in total among the ortho and para positions are occupied by substituents. Preference in $X_6$ to $X_{10}$, in $X_{11}$ to $X_{15}$, in $X_{16}$ to $X_{20}$, and in $X_{21}$ to $X_{25}$, is similar to that in $X_1$ to $X_5$.

In the formulas (5) to (8), $R_1$ to $R_6$ each independently represents a hydrogen atom, a $C_1$ to $C_4$ alkyl group, carboxyl group, an alkyloxycarbonyl group whose alkyl group is a $C_1$ to $C_{22}$ alkyl group, a hydroxyalkyloxycarbonyl group whose alkyl group a $C_1$ to $C_{12}$ alkyl group, or an isocyanate group, and $R_7$ and $R_8$ each independently represents a hydrogen atom or a $C_1$ to $C_4$ alkyl group, with the proviso that at least two of $R_1$ to $R_4$ represent a carboxyl group, and at least one of $R_5$ and $R_6$ represents a carboxyl group, a hydroxyalkyloxycarbonyl group whose alkyl group is a $C_1$ to $C_{12}$ alkyl group, or an isocyanate group.

Examples of the alkyl group represented by $R_1$ to $R_8$ include $C_1$ to $C_4$ alkyl groups, such as methyl group, ethyl group, propyl group, sec-propyl group, butyl group, sec-butyl group and tert-butyl group. Examples of the alkyloxycarbonyl group include alkyloxycarbonyl groups whose alkyl group is a $C_1$ to $C_{22}$, preferably $C_1$ to $C_4$ alkyl group, such as methyloxycarbonyl group, ethyloxycarbonyl group, propyloxycarbonyl group, sec-propyloxycarbonyl group, butyloxycarbonyl group, sec-butyloxycarbonyl group, tert-butyloxycarbonyl group, hexyloxycarbonyl group, octyloxycarbonyl group, decyloxycarbonyl group, dodecyloxycarbonyl group and octadecyloxycarbonyl group.

Examples of the hydroxyalkyloxycarbonyl group include hydroxyalkyloxycarbonyl groups whose alkyl group is a $C_1$ to $C_{12}$, preferably $C_1$ to $C_6$ alkyl group, such as hydroxymethyloxycarbonyl group, hydroxyethyloxycarbonyl group, hydroxypropyloxycarbonyl group, hydroxybutyloxycarbonyl group, hydroxyhexyloxycarbonyl group, hydroxyoctyloxycarbonyl group, hydroxydecyloxycarbonyl group and hydroxydodecyloxycarbonyl group.

The diarylamino group-containing copolymer (a) can be produced by radical-polymerizing a monomer represented by the following formula (9):

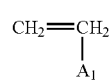

(9)

$A_1$ in the formula (9) and $A_1$ in the formula (1) are the same, with a monomer represented by any of the following formulas (10) to (13):

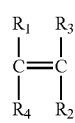

(10)

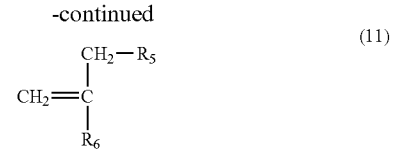

(11)

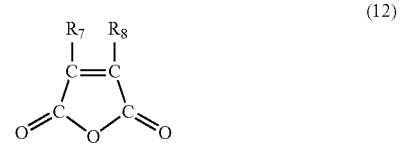

(12)

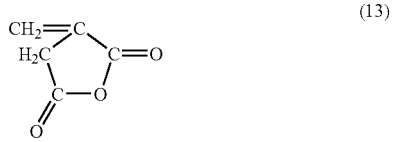

(13)

$R_1$ to $R_8$ in the formulas (10) to (13) and $R_1$ to $R_8$ in the formulas (4) to (7) are the same.

Examples of the compounds represented by the formulas (10) to (13) include compounds having two carboxyl groups such as itaconic acid, maleic acid, fumaric acid, citraconic acid, mesaconic acid, dialkylmaleic acid and dialkylfumaric acid; and carboxylic anhydride compounds such as itaconic anhydride, maleic anhydride, citraconic anhydride and dialkylmaleic anhydride. Examples of the alkyl group contained in dialkylmaleic acid, dialkylfumaric acid, and anhydrides thereof include $C_1$ to $C_4$ alkyl groups, and also include monoalkyl esters of the compound having two carboxyl groups. Examples of the alkyl group contained in the monoalkyl ester include $C_1$ to $C_{22}$ alkyl groups.

In the radical polymerization, since the polymerization reaction is initiated by a radical polymerization initiator, and the growth of chain is terminated by radical recombination or chain transfer in almost all cases, the molecular chain terminal of the diarylamino group-containing copolymer (a) is replaced by the used radical polymerization initiator residue or hydrogen atom. However, a terminal group may be an ethylenic double bond when the terminal reaction is disproportionation. When using a chain transfer agent, the molecular chain terminal may be a chain transfer agent residue.

The monomer represented by the formula (9) exhibits radical homopolymerizability, while the monomers represented by the formulas (10) to (13) do not exhibit radical homopolymerizability, and therefore, there is a tendency for $m \geq n$.

The radical polymerization reaction may be conducted by conventionally used methods such as a thermopolymerization method or a photopolymerization method. For example, the diarylamino group-containing copolymer (a) can be produced by reacting the monomer represented by the formula (9) with the monomers represented by the formulas (10) to (13) and a radical polymerization initiator in a solvent at 40 to 100° C., preferably 60 to 80° C., for 10 minutes to 72 hours, and preferably 6 to 24 hours.

Examples of the solvent used in the radical polymerization reaction include aliphatic hydrocarbons such as hexane and decane; aromatic hydrocarbons such as benzene, toluene and xylene; ether-based compounds such as diethyl ether, tetrahydrofuran, 1,4-dioxane and 1,2-dimethoxyethane; and carbon tetrachloride, and any of the conventionally used solvents can be used as long as they are solvents capable of dissolving the monomer represented by the formula (9) and the monomers represented by the formulas (10) to (13).

The mixing ratio of the monomer represented by the formula (9) to the monomers represented by the formulas (10) to (13) is not specifically limited; however, when a ratio of m to n in the formula (1) is from 1:1 to 4:1, the amount of the monomer represented by the formula (9) may be from 0.2 to 3 mol per molecule of the monomer represented by the formulas (10) to (13).

Examples of the radical polymerization initiator used in the radical polymerization reaction include azo type initiators such as 2,2'-azobisbutyronitrile, 2,2'-azobiscyclohexanecarbonitrile, 4,4'-azobis(4-cyanovaleric acid) and dimethyl 2,2'-azobisisobutyrate; peroxide type initiators such as benzoyl peroxide and t-butylhydroperoxide; and aromatic carbonyl type initiators such as diethoxyacetophenone, benzyldimethyl ketal, benzyl-β-methoxyethyl acetal, 1-hydroxycyclohexylphenyl ketone and 4-t-butyltrichloroacetophenone. Also, disulfide type initiators can be used such as tetraethylthiuram disulfide; nitro olefin initiators such as 2,2,6,6-tetramethylpiperidine-1-oxyl; and living radical polymerization initiators such as 4,4'-di-t-butyl-2,2'-bipyridine copper complex-methyl trichloroacetate complex.

Next, an organic electroluminescent device of the present invention will be described. The organic electroluminescent device of the present invention comprises an anode, a hole transport layer, an emitter layer and a cathode on a transparent support, the hole transport layer comprising a layer made of a copolymer represented by the formula (8) (hereinafter, this copolymer is simply called "copolymer (b)").

The simplest structure of the organic electroluminescent device of the present invention is a structure in which the hole transport layer made of the copolymer (b) and the emitter layer are interposed between the anode and the cathode, which are formed on the transparent support. Other examples include an organic electroluminescent device in which the hole transport layer made of the copolymer (b), a hole transport layer made of a hole transport material other than the copolymer (b), an electron transport layer and an electron injecting layer are interposed between the anode and the cathode. However, the organic electroluminescent device of the present invention is not limited to these structures. The respective layers described herein are expressed by functions and may be composed of plural layers.

In the organic electroluminescent device of the present invention, the transparent support is not specifically limited, as long as it has sufficient mechanical strength and heat resistance and is also transparent, and examples thereof include glass substrates made of soda lime glass and non-alkali glass, and a transparent resin substrate such as polyethylene substrate, polyether sulfone substrate and polypropylene substrate.

Examples of the material used for the anode in the organic electroluminescent device of the present invention include conductive metal oxides, metals and alloys, which allow a coupling agent having a functional group capable of forming covalent bonds with a functional group of the copolymer represented by the formula (8) to be bonded on the surface when they are brought into contact with the coupling agent. Examples thereof include conductive metal oxides such as indium tin oxide (ITO), indium oxide, tin oxide, zinc oxide and titanium oxide; metals such as gold, silver and platinum; and alloys thereof. Among these, materials having a work function of more than 4 eV are preferable, since holes cannot be efficiently injected into the hole transport layer when the work function is less than 4 eV. It is particularly preferable to use an ITO thin film formed on the transparent support by methods such as a vacuum deposition method, sputtering method or ion plating method in view of ease of production.

The anode used in the present invention preferably has low resistivity because power consumption of the organic electroluminescent device of the present invention can be reduced. Although ITO thin film having a surface resistivity of 300 $\Omega/\square$ or less is satisfactory for the anode, it is preferable to use an electrode having a surface resistivity of 20 $\Omega/\square$ or less. The thickness of the ITO thin film can be selected according to the resistance value, but is preferably selected within a range of 100 to 300 nm.

The hole transport layer of the present invention is made of the copolymer (b) represented by the formula (8). $A_2$ in the copolymer (b) may be an electron-donating group having a hole transport function. As the electron-donating group, there can be used groups, for example, benzidine type, phenylenediamine type or styrylamine type oligo(triarylamine)-containing group, N,N-diaryl-substituted amino group such as triarylamino group or carbazolyl group, phenyl group having the N,N-diaryl-substituted amino group, naphthyl group having the N,N-diaryl-substituted amino group, trialkylamino group, pyrazoline-containing group, stilbene-containing group, hydrazone-containing group, oxadiazole-containing group, phthalocyanine-containing group, naphthalocyanine-containing group, porphyrin-containing group, and $C_{60}$-containing group.

Among these groups, the N,N-diaryl-substituted amino group and the group having the amino group are preferable and groups represented by the formulas (2) and (3) are more preferable because they can be easily introduced into the polymer by techniques in synthetic chemistry, and because the ionization potential can be easily controlled by various substituents on the constituent aryl ring.

$J_2$ in the copolymer (b) is a monomer unit of a compound having at least one functional group and a polymerizable unsaturated bond, in which the polymerizable unsaturated bond moiety is cleaved (this monomer unit is hereinafter simply called "polymerizable unsaturated monomer unit (c)"). Cleavage of the polymerizable unsaturated bond moiety of the compound constituting the polymerizable unsaturated monomer unit (c) causes polymerization with a monomer unit having an electron-donating group $A_2$ on the side chain, and thus a copolymer (b) can be formed. At least one functional group makes it possible to bond with the anode surface by a chemical bond through a coupling agent having a functional group capable of forming covalent bonds with the functional group.

Examples of the functional group of the polymerizable unsaturated monomer unit (c) include carboxyl group, hydroxyl group, amino group, isocyanate group, glycidyl group and cyclic carboxylic anhydride group. Among these groups, carboxyl group, hydroxyl group, isocyanate group and cyclic carboxylic anhydride group are preferable because they can be easily introduced into the polymer by techniques in synthetic chemistry, and because the hole transport layer of the organic electroluminescent device can be easily produced.

Examples of the compound having a polymerizable unsaturated bond constituting the polymerizable unsaturated monomer unit (c) include compounds having one carboxyl group, such as (meth)acrylic acid, α-ethylacrylic acid, crotonic acid, trans-2-pentenoic acid, trans-2-methyl-2-pentenoic acid and 4-vinylbenzoic acid, and hydroxyalkyl esters of these monomers, in addition to the compound represented by $J_1$. Examples of the alkyl group of the hydroxyalkyl ester include $C_1$ to $C_{12}$ alkyl groups.

The compound having a polymerizable unsaturated bond further includes compounds having one amino group, such as allylamine, N-methylallylamine, N-allylcyclopentylamine, N-allylcyclohexylamine, 3-amino-1-propyl vinyl ether, N-allylaniline and 4-vinylaniline; compounds having an amino group, such as diallylamine and triallylamine; and compounds having an isocyanate group, such as 1-methylvinylisocyanate and 1-ethylvinylisocyanate.

The polymerizable unsaturated monomer unit made of compounds having two carboxyl groups, such as itaconic acid, maleic acid, fumaric acid, citraconic acid, mesaconic acid, dialkylmaleic acid and dialkylfumaric acid, and monoalkyl esters thereof; hydroxyalkyl esters of compounds having one carboxyl group, such as (meth)acrylic acid, α-ethylacrylic acid and 4-vinylbenzoic acid; and compounds having an isocyanate group, such as 1-methylvinyl isocyanate among these compounds is preferable because the hole transport layer of the organic electroluminescent device can be easily produced.

Furthermore, the monomer units represented by the formulas (4) to (7) are preferable because they are easily introduced into the polymer by techniques in synthetic chemistry, and because the hole transport layer of the organic electroluminescent device is easily produced. The copolymer (b) is most preferably a diarylamino group-containing copolymer (a) represented by the general formula (1) because the hole transport layer of the organic electroluminescent device is easily produced.

The hole transport layer of the organic electroluminescent device of the present invention may be a layer made only of the copolymer (b), or a multi-layer of a layer made of the copolymer (b) and a layer of another material. Also, it may be a layer wherein a layer made of the copolymer (b) and a layer made of a compound having two or more groups per molecule which are capable of reacting with a functional group of the copolymer (b) are alternately laminated via a chemical bond.

Next, the method of producing the hole transport layer will be described. In the present invention, the hole transport layer for an organic electroluminescent device is produced by a method comprising the steps of: (I) bringing a solution containing a coupling agent having a functional group capable of forming covalent bonds with a functional group of the copolymer (this coupling agent is hereinafter simply called "functional group-containing coupling agent (d)") into contact with the surface of the anode provided on the transparent support to form a layer made of the coupling agent (d), and (II) bringing a solution containing the copolymer (b) into contact with the surface of the layer made of the functional group-containing coupling agent (d) to form a layer made of the copolymer (b).

The method may further comprises the step (III) of bringing a solution containing a compound having two or more functional groups per molecule which are capable of forming covalent bonds with a functional group of the copolymer (b) (hereinafter, the compound is merely abbreviated to a functional group-containing compound (e)) into contact with the surface of the layer made of the copolymer (b) to form a layer made of the functional compound (e), after the step (II).

In the present invention, the hole transport layer for organic electroluminescent device can also be produced by the method comprising the steps of:
(i) bringing a solution containing the functional group-containing coupling agent (d) into contact with the surface of the anode provided on the transparent support to form a layer made of the functional group-containing coupling agent (d),
(ii) bringing a solution containing the copolymer (b) into contact with the surface of the layer made of the functional group-containing coupling agent (d) to form a layer made of the copolymer (b),
(iii) bringing a solution containing the functional group-containing coupling agent (e) into contact with the surface of the layer made of the copolymer (b) to form a layer made of the functional group-containing coupling agent (e), and
(iv) alternately laminating at least one layer made of the copolymer (b) and at least one layer made of the functional group-containing coupling agent (e), in this order, after the step (iii).

When at least one layer of the copolymer (b) and at least one layer of the functional group-containing compound (e) are alternately laminated in the method of producing the hole transport layer for an organic electroluminescent device, the last step may be either the step of laminating the layer made of the copolymer (b) or the step of laminating the layer made of the functional group-containing compound (e).

It is possible to increase the proportion of covalent bonds between the copolymer (b) and the functional group-containing coupling agent (d) or covalent bonds between the copolymer (b) and the reactive group-containing compound (e) by heating after each of steps (I) to (III), or each of steps (i) to (iv), or after any step.

In the case in which at least one layer made of the copolymer (b) and at least one layer made of the functional group-containing compound (e) are alternately laminated, the copolymer (b) and the functional group-containing compound (e) used need not be the same.

In the hole transport layer having a multi-layered structure produced by using plural kinds of copolymers (b), copolymer layers are preferably provided in the order of increase in an ionization potential from the anode because hole transport efficiency is improved in the organic electroluminescent device.

The functional group of the copolymer (b) in these methods is the same as that described above and, as the functional group of the functional group-containing coupling agent (d) and functional group-containing compound (e), a functional group capable of forming covalent bonds with the functional group of the copolymer (b) is used. Examples of the functional group include amino group, isocyanate group, hydroxyl group, carboxyl group, glycidyl group, halocarbonyl group and acid anhydride group, which are capable of forming covalent bonds with the functional group of the copolymer (b). The functional groups in a functional group-containing coupling agent (d) or in a functional group-containing compound (e) may be the same or different.

In the functional group-containing coupling agent (d), examples of the coupling agent having an amino group include amino group-containing silane coupling agents such as 3-aminopropyltrichlorosilane, 3-aminopropylmethyldichlorosilane, 3-aminopropyltrimethoxysilane, 3-aminopropyltriethoxysilane, 6-aminohexyltrichlorosilane and 11-aminoundecyltrichlorosilane; mercaptans having an amino group at the end, such as 2-aminoethylmercaptan, 3-aminopropylmercaptancystamine, 4-aminothiophenol and 2,2'-diaminoethylsulfide; and amino group-containing sulfur compounds such as sulfide and disulfide compounds.

Examples of the coupling agent having an isocyanate group include silane coupling agents such as 3-trichlorosilylpropylisocyanate, 3-methyldichlorosilylpropylisocyanate, 3-dimethylchlorosilylpropylisocyanate, 6-trichlorosilylhexylisocyanate and 11-trichlorosilylundecylisocyanate; and mercaptan compounds having an isocyanate group at the end, such as 2-mercaptoethylisocyanate, 3-mercaptopropylisocyanate and 4-mercaptobutylisocyanate.

Examples of the coupling agent having a hydroxyl group include mercaptan and sulfide compounds having an amino group at the end, such as 2-hydroxyethylmercaptan, 3-hydroxypropylmercaptan, 4-hydroxybutylmercaptan, 6-hydroxyhexylmercaptan, 12-hydroxydodecylmercaptan and 2,2'-dihydroxyethylsulfide.

Examples of the coupling agent having a carboxyl group include mercaptan compounds having a carboxyl group at the end, such as 2-mercaptoacetic acid, 3-mercaptopropionic acid, 4-mercaptobutanoic acid, 6-mercaptohexanoic acid and 12-mercaptododecanoic acid.

Examples of the coupling agent having a glycidyl group include amino group-containing silane coupling agents such as 3-glycidoxypropyltrichlorosilane, 3-glycidoxypropyltrimethoxysilane, 6-glycidoxyhexyltrichlorosilane and 11-glycidoxyundecyltrichlorosilane; and sulfur compound, for example, mercaptans having a glycidoxy group at the end, such as 2-glycidoxyethylmercaptan, 3-glycidoxypropylmercaptan and 6-glycidoxyhexylmercaptan.

In the functional group-containing compound (e), examples of the compound having two or more amino groups per molecule include aliphatic diamines such as ethylenediamine, 1,3-diaminopropane, 1,4-diaminobutane, 2,2-dimethyl-1,3-propanediamine, 1,6-diaminohexane, 2,2'-(ethylenedioxy)-bis(ethylamine), cystamine, 4-(aminomethyl)piperidine, piperazine and homopiperazine; aliphatic tetramines such as tetraethylenepentamine, pentaethylenehexamine, cyclene and tetraazacyclopentadecane; aromatic diamines such as 4,4'-ethylenedianiline, 4,4'-oxydianiline, 4,4'-thiodianiline, 1,3-phenylenediamine, 1,5-diaminonaphthalene and 2,7-diaminofluorene; and polyethyleneimine, polyallylamine and poly(4-vinylaniline).

Examples of the compound having two or more isocyanate groups per molecule include ethylene diisocyanate, propane-1,3-diisocyanate, butane-1,4-diisocyanate and hexane-1,6-diisocyanate.

Examples of the compound having two or more hydroxyl groups per molecule include ethylene glycol, 1,3-dihydroxypropane, 1,4-dihydroxybutane, 1,6-dihydroxyhexane and glycerol.

Examples of the compound having two or more carboxyl groups per molecule include malonic acid, succinic acid, glutaric acid, adipic acid, hexane-1,6-dicarboxylic acid, octane-1,8-dicarboxylic acid, decane-1,10-dicarboxylic acid, dodecane-1,12-dicarboxylic acid, phthalic acid, isophthalic acid and terephthalic acid.

Examples of the compound having two or more glycidyl groups per molecule include 1,2-diglycidoxyethane, 1,3-diglycidoxypropane, 1,4-diglycidoxybutane and 1,6-diglycidoxyhexane.

Examples of the compound having two or more halocarbonyl groups per molecule include malonic acid dichloride, malonic acid dibromide, succinic acid dichloride, succinic acid dibromide, glutaric acid dichloride, glutaric acid dibromide, adipic acid dichloride, adipic acid dibromide, hexane-1,6-dicarboxylic acid dichloride, hexane-1,6-dicarboxylic acid dibromide, octane-1,8-dicarboxylic acid dichloride, phthalic acid dichloride and phthalic acid dibromide.

Examples of the compound having two or more acid anhydride groups per molecule include pyromellitic dianhydride, hexafluoroisopropylidene-2,2-bis(phthalic anhydride), 3,3',4,4'-diphenylsulfonetetracarboxylic dianhydride and 3,3',4,4'-diphenyltetracarboxylic dianhydride.

The organic electroluminescent device of the present invention can be produced by the methods described above. It is preferable to use a diarylamino group-containing copolymer (a) as the copolymer (b), to use an amino group-containing coupling agent as the corresponding functional group-containing coupling agent (d) and to use a compound having two or more amino groups per molecule as the reactive group-containing compound (e) because the copolymer is easily produced and the hole transport layer of the organic electroluminescent device are easily produced.

The method of producing the hole transport layer for an organic electroluminescent device of the present invention will now be described in detail by way of a method of using the diarylamino group-containing copolymer (a) as the copolymer (b).

First, the step of bringing a solution containing an amino group-containing coupling agent into contact with the anode surface, thereby to bond the amino group-containing coupling agent with the anode surface to form a layer made of the amino group-containing coupling agent will be described.

In the case of using conductive metal oxides such as indium tin oxide (ITO), indium oxide, tin oxide, zinc oxide and titanium oxide in the anode, the above-mentioned amino group-containing silane coupling agent may be used as the amino group-containing coupling agent.

Examples of the method of bringing the amino group-containing silane coupling agent into contact with the anode surface, thereby to bond with the anode surface include a method of applying a solution of the silane coupling agent on the anode surface and a method of dipping in the solution, thereby to bond the silane coupling agent with the anode surface, and washing with a solvent capable of dissolving the silane coupling agent, followed by drying or heating.

Examples of the solvent capable of dissolving the amino group-containing silane coupling agent include aliphatic hydrocarbons such as hexane, decane and hexadecane; aromatic hydrocarbons such as benzene, toluene and xylene; halogenated hydrocarbons such as carbon tetrachloride, chloroform, methylene chloride and 1,1,2-trichloroethane; ether-based compounds such as diethyl ether, tetrahydrofuran, 1,4-dioxane and 1,2-dimethoxyethane; and alcohol type solvents such as methanol, ethanol and 2-propanol. In the case of the silane coupling agent having a halogen atom, as the substituent, on a silicon atom, a solvent having a carbonyl group and a solvent having reaction activity with an amino group cannot be used. In the case in which a halogen atom, as the substituent, does not exist on a silicon atom, ketone type solvents such as acetone and 2-butanone, and solvent mixtures thereof can be used.

The concentration of the amino group-containing silane coupling agent in the solution is preferably within a range of 0.1 to 100 mmol/L. When the concentration of the silane coupling agent in the solution is less than 0.001 mmol/L, there is a tendency for bonding of the silane coupling agent with the anode surface to take a long time.

In the case of bonding the silane coupling agent with the anode surface using a solution of the amino group-containing silane coupling agent, the temperature is preferably within a range of 15 to 80° C. Also, the contact time is preferably within a range of 1 to 3 hours. When the reaction temperature is low, the reaction takes a long time. On the other hand, when the reaction temperature is high, the reaction is completed within a short time.

After the anode is brought into contact with the solution of the amino group-containing silane coupling agent, excess silane coupling agent remained without being bonded with the anode surface is removed by washing with the solvent capable of dissolving the silane coupling agent. After the washing operation, drying may be conducted at a temperature within a range of 10 to 100° C. under reduced pressure, or may be conducted by blowing a gas such as air, nitrogen or argon. Heating of the anode after the washing operation is effective to completely react the anode surface with the silane coupling agent. In this case, the heating temperature is preferably within a range of 50 to 120° C.

When using metals such as gold, silver and platinum, or alloys for the anode, the above-mentioned amino group-containing sulfur compound may be used as the amino group-containing coupling agent.

Next, the step of bringing a solution containing a diarylamino group-containing copolymer (a) into contact with the surface of a layer made of the amino group-containing coupling agent to form a layer made of the diarylamino group-containing copolymer (a) will be described.

Examples of the method of forming the layer made of the diarylamino group-containing copolymer (a) on the surface of the layer made of the amino group-containing coupling agent include a method of dissolving the diarylamino group-containing copolymer (a) in a solvent, bringing the solution into contact with the layer made of the amino group-containing coupling agent, and washing the anode with a solvent capable of dissolving the diarylamino group-containing copolymer (a), followed by drying.

In the case of the diarylamino group-containing copolymer (a) having a carboxyl group or a carboxylic anhydride group, the above operation allows the diarylamino group-containing copolymer to be chemically adsorbed onto the layer of the coupling agent on the anode surface through an interaction between the coupling agent and the amino groups.

As the solvent capable of dissolving the diarylamino group-containing copolymer (a), for example, it is possible to use an organic solvent which can dissolve the diarylamino group-containing copolymer (a) and does not react with the diarylamino group-containing copolymer (a) and the amino group-containing coupling agent, and mixtures thereof.

Examples of the organic solvent which dissolve the diarylamino group-containing copolymer (a), include alcohol type solvents such as methanol, ethanol, propanol and 2-propanol; ketone type solvents such as acetone and 2-butanone; ether type solvents such as diethyl ether, tetrahydrofuran, 1,4-dioxane and 1,2-dimethoxyethane; aprotic polar solvents such as formamide, N-methylformamide, N,N-dimethylformamide, dimethyl sulfoxide and hexamethylphosphoric triamide; aliphatic hydrocarbons such as hexane, decane and hexadecane; aromatic hydrocarbons such as benzene, toluene and xylene; and halogenated hydrocarbons such as carbon tetrachloride, chloroform, methylene chloride and 1,1,2-trichloroethane.

When the solution containing the diarylamino group-containing copolymer (a) is brought into contact with the layer made of the amino group-containing coupling agent so as to have the diarylamino group-containing copolymer (a) adsorbed onto the surface of the layer of the amino group-containing coupling agent, the temperature is preferably within a range of 15 to 100° C. The contact time is preferably within a range of 1 to 3 hours. When the temperature is low, the adsorption takes a long time. On the other hand, when the temperature is high, the adsorption is completed within a short time.

After the solution containing the diarylamino group-containing copolymer (a) is brought into contact with the surface of the layer made of the amino group-containing coupling agent, excess diarylamino group-containing copolymer (a), which is left unadsorbed, is removed by washing with a solvent capable of dissolving the diarylamino group-containing copolymer (a). After the washing operation, drying may be conducted at a temperature within a range of 10 to 100° C. under reduced pressure, or may be conducted by blowing a gas such as air, nitrogen or argon.

After drying, a coupling agent having an amino group is bonded through an amide bond or an imide bond by heating, thereby making it possible to improve adhesion between the anode and the hole transport layer. The heating temperature is preferably within a range of 120 to 250° C. The heating operation may be conducted under reduced pressure.

Next, the step of bringing the solution containing a compound having two or more amino groups per molecule into contact with the surface of the layer made of the diarylamino group-containing copolymer (a) to form a layer made of the compound having two or more amino groups per molecule will be described.

As the compound having two or more amino groups per molecule, for example, there can be used compounds such as aliphatic diamines, aliphatic tetramines, aromatic diamines, polyethyleneimine, polyallylamine and poly(4-vinylaniline). Among these compounds, compounds having the ability to adsorb large amounts of the diarylamino group-containing copolymer (a), for example, ethylenediamine, trans-1,4-diaminocyclohexane, polyethyleneimine, polyallylamine, ethylenediisocyanate, propane-1,3-diisocyanate, ethylene glycol, 1,3-dihydroxypropane and glycerol are preferably used.

As the compound having two or more amino groups per molecule, there can be used an organic solvent which can dissolve the compound and does not react with a functional group of the anode surface onto which the compound and the diarylamino group-containing copolymer (a) were adsorbed, or mixtures thereof.

As the organic solvent, the same organic solvent described as the organic solvent capable of dissolving the diarylamino group-containing copolymer (a) can be used.

When the solution containing a compound having two or more amino groups per molecule is brought into contact with the layer made of the diarylamino group-containing copolymer (a) so as to have this compound onto the surface of the layer of the diarylamino group-containing copolymer (a), the temperature is preferably within a range of 15 to 100° C. The contact time is preferably within a range of 1 to 3 hours. When the temperature is low, the adsorption takes a long time. On the other hand, when the temperature is high, the adsorption is completed within a short time.

After the solution containing a compound having two or more amino groups per molecule is brought into contact with the surface of the layer made of the diarylamino group-containing copolymer (a), excess compound, which is left unadsorbed, is removed by washing with the solvent capable of dissolving the compound. After a washing operation, drying may be conducted at a temperature within a range of 10 to 100° C. under reduced pressure, or may be conducted by blowing a gas such as air, nitrogen or argon.

When using the diarylamino group-containing copolymer (a) having a carboxyl group or a carboxylic anhydride group, a compound having two or more amino groups is bonded through an amide bond or an imide bond by heating, thereby making it possible to improve adhesion between the anode and the hole transport layer. The heating temperature is preferably within a range of 120 to 250° C. The heating operation may be conducted under reduced pressure.

To produce a copolymer thin film which is layered with plural layers made of the diarylamino group-containing copolymer (a), two or more layers including the layer made of the diarylamino group-containing copolymer (a) and the layer made of the compound having two or more amino groups per molecule may be alternately laminated in this order on the coupling agent layer having an amino group bonded with the anode. The number of layers to be formed is not specifically limited.

By carrying out heating each time after the diarylamino group-containing copolymer (a) is adsorbed onto the anode surface to which the coupling agent having an amino group is bonded, and after the compound having two or more amino groups per molecule is adsorbed, the diarylamino group-containing copolymer (a) is bonded with the compound having two or more amino groups per molecule through an amide bond or an imide bond, and it is thus possible to produce a copolymer thin film which is layered with plural layers made of the diarylamino group-containing copolymer (a).

In the repeating of adsorption of the diarylamino group-containing copolymer (a) and adsorption of the compound having two or more amino, isocyanate or hydroxyl groups per molecule, heating may be conducted after each adsorption step, or may be conducted after any adsorption step, or may be conducted once after the entire adsorption step.

According to the method described above, when using the diarylamino group-containing copolymer (a) having a carboxyl group or a carboxylic anhydride group as the copolymer (b), a hole transport layer for an organic electroluminescent device can be produced by using a coupling agent having an amino group as the functional group-containing coupling agent (d) and using a compound having two or more amino groups per molecule as the functional group-containing compound (e).

The film thickness of the hole transport layer made of the copolymer (b) or the hole transport layer in which plural layers made of the copolymer (b) and the functional group-containing compound (e) are laminated via covalent bonds is preferably within a range of 1 to 100 nm. According to the method of producing the hole transport layer for an organic electroluminescent device, a hole transport layer having a film thickness of 1 to 100 nm can be simply formed. The hole transport layer formed by the above method has good thickness accuracy and has a very smooth surface. For example, in the hole transport layer having a film thickness of 50 nm, standard deviation of the film thickness was within ±2.0 nm and root-mean-square surface roughness ($R_{ms}$ value) was within 2.0 nm.

In the hole transport layer, since the bonds between the copolymer (b) and the functional group-containing coupling agent (d) or the functional group-containing compound (e) are covalent bonds such as amide bonds, imide bonds, ester bonds, urethane bonds or urea bonds, the hole transport layer has high adhesion with the anode and is not dissolved in solvents after the bonds are formed. Therefore, the hole transport layer is excellent in solvent resistance and is suitable for production of a multi-layered organic electroluminescent device using a wet film formation method.

The electroluminescent device of the present invention may have a multi-layered structure comprising a hole transport layer made of a hole transport material other than the copolymer (b) at the side of an emitter layer, in addition to the hole transport layer made of the copolymer (b).

In this case, the number of layers of the hole transport layer made of the hole transport material other than the copolymer (b) is not specifically limited. However, since an increase in film thickness of the overall organic layer between the anode and the cathode may cause an increase in drive voltage of the device, the film thickness of the hole transport layer is preferably from 10 to 100 nm, and particularly preferably from 20 to 70 nm.

In the organic electroluminescent device, the hole transport material other than the copolymer (b) is preferably a material having a larger ionization potential than that of the copolymer (b) used to improve the hole transport efficiency.

Examples of the hole transport material other than the copolymer (b) include conventionally known low molecular-weight compounds, for example, benzidine type, phenylenediamine type and styrylamine type triphenylamine derivatives, tertiary amines such as carbazole, pyrazoline derivatives, stilbene derivatives, hydrazone derivatives, oxadiazole derivatives, phthalocyanine derivatives, naphthalocyanine derivatives, porphyrin derivatives and $C_{60}$ derivatives; and conventionally known conjugated polymers, for example, polyphenylenevinylene derivatives, polyparaphenylene derivatives, polythiophene derivatives and polyfluorene derivatives.

In the organic electroluminescent device of the present invention, the emitter layer may be a layer made only of an emitter material, or a layer containing an auxiliary emitter material, in addition to the emitter material. Examples of the emitter material or auxiliary emitter material used in the emitter layer include conventionally known condensed aromatic compounds such as anthracene, naphthalene, phenanthrene, pyrene, tetracene, coronene, chrysene, fluorescein and perylene; bisstyrylanthracene derivatives, tetraphenylbutadiene derivatives, coumarin derivatives, oxadiazole derivatives, distyrylbenzene derivatives, pyrrolopyridine derivatives, penoline derivatives, cyclopentadiene derivatives, thiadiazolopyridine derivatives, quinolinonol type metal complex derivatives, azomethine type metal complex derivatives, rare earth metal complex derivatives, oxadiazole type metal complex derivatives, thiadiazole type metal complex derivatives, porphyrin derivatives, pyridine type metal complex derivatives; and conjugated polymers such as polyphenylenevinylene derivatives, polyparaphenylene derivatives, polythiophene derivatives and polyfluorene derivatives.

The organic electroluminescent device of the present invention may further comprise an electron transport layer between the emitter layer and the cathode. The electron transport layer is made of an electron transport material capable of efficiently injecting electrons from the cathode and efficiently transporting injected electrons to the emitter layer. Therefore, it is necessary that the electron transport material be a material which has high electron affinity, large electron mobility and excellent stability and is less likely to produce impurities which are electron traps. Examples of the material, which meet the above conditions, include quinolinol type metal complex derivatives such as quinolinol aluminum complex ($Alq_3$) and benzoquinolinol beryllium complex ($Bebq_2$); and oxadiazole derivatives and triazole derivatives.

In the organic electroluminescent device of the present invention, the electron transport layer and the electron injecting layer may be interposed between the anode and the cathode. Such interposition of the electron injecting layer is effective to enhance injections of electrons from the cathode into the electron transport layer in the electric field.

Examples of the electron injecting material used in the electron injecting layer include commonly used metal oxides such as lithium oxide, magnesium oxide and aluminum oxide; metal fluorides such as lithium fluoride, magnesium fluoride and strontium fluoride; and metal complexes and metal salts of organic compounds, such as quinolinol lithium complex, acetyl acetolithium complex, di-tert-butyloyl-methanatolithium complex and benzoyl lithium salt.

Examples of the material of the cathode used in the organic electroluminescent device of the present invention include metals such as gold, silver, platinum, copper, iron, tin, lead, titanium, aluminum, indium, yttrium, ruthenium, manganese, lithium, sodium, potassium, calcium and magnesium, and alloys thereof. Among these materials, materials having a work function of less than 4 eV are preferable. To enhance the electron injection efficiency and to improve device characteristics, a metal having a low work function, such as lithium, sodium, potassium, calcium and magnesium, and alloys thereof is particularly effective. When using a metal, which is unstable in air, among these metals having a low work function, it is preferable to laminate the layer of the metal with a layer of an inorganic substance, for example, a metal such as gold, silver, platinum, copper, iron, tin, aluminum, indium, and alloys thereof, and silica and titania, or with a layer of an organic polymeric compound such as polyvinyl alcohol and vinyl chloride, so as to protect the electrode. Examples of the method of producing the electrode include, but are not limited to, electron beam deposition methods, sputtering methods, ion plating methods and coating methods, as long as electrical conduction can be obtained.

To enable the organic electroluminescent device of the present invention to efficiently emit light, it is preferable to make at least one of the anode and the cathode transparent in a light emission wavelength range of the organic electroluminescent device. A transparent electrode can be set to ensure a predetermined transparency by the deposition or sputtering method using the above-mentioned conductive materials.

It is possible to observe light emission from the side of a transparent or translucent electrode by applying (+) voltage of about 5 to 40 V to the anode and applying (−) voltage of about 5 to 40 V to the cathode in the organic electroluminescent device thus obtained. Although the voltage generally refers to AC voltage, pulse voltage and DC voltage can also be used. If DC voltage is applied, light emission can be observed only when (+) voltage is applied to the anode and (−) voltage is applied to the cathode. AC voltage to be applied may have any waveform.

In the organic electroluminescent device of the present invention, the respective organic layers can be formed by a wet film formation method such as spin coating or dipping method. In the case of the wet film formation method, materials constituting the respective layers may be dissolved or dispersed in an appropriate solvent such as chloroform, tetrahydrofuran or dioxane and the resulting coating solution may be used to form a thin film. Also, the other organic layer other than the hole transport layer made of the copolymer (b) or the hole transport layer, in which the copolymer (b) and the reactive group-containing compound (e) form a chemical bond, can be formed by a dry film formation method such as a vacuum deposition, sputtering or ion plating method according to the material constituting the organic layer.

The film thickness of the overall organic layer between the anode and the cathode is preferably within a range of 20 nm to 10 μm, and is particularly preferably from 50 to 200 nm. When the film thickness is too great, a large applied voltage is required to obtain a constant optical output and the emission efficiency is reduced. On the other hand, when the film thickness is too small, pinholes are generated and sufficient emission luminance cannot be obtained even if an electric field is applied.

The organic electroluminescent device of the present invention exhibits high adhesion between the hole transport layer and the anode, and thus high light emission having high luminance can be obtained even when driven by low applied voltages. For example, the organic electroluminescent device of the present invention exhibits current value and emission luminance which are 1.1 to 2 times higher than those of the same organic electroluminescent device, when the same applied voltage is applied, with the exception that the hole transport layer is made of a conventional polymer.

EXAMPLES

The present invention will be described in detail by way of the following Examples.

Synthesis Example 1

Synthesis of Copolymer (b1)

In a reactor equipped with a stirrer and a reflux condenser, 27 g (0.12 mol) of 1,4-dibromobenzene, 0.52 g (0.00057 mol) of tris(dibenzylideneacetone)dipalladium (0), 0.48 g (0.00086 mol) of 1,1'-bis(diphenylphosphino)ferrocene and 50 ml of toluene were added, followed by stirring in an argon gas atmosphere at room temperature for 15 minutes.

To the mixture, 5.5 g (0.057 mol) of sodium-tert-butoxide and 7.0 g (0.038 mol) of m-tolylphenylamine were added and, after heating to 95° C., the mixture was continuously stirred for 20 hours. After air cooling, 120 ml of water and 60 ml of diethyl ether were added to the mixture and the separated organic phase was washed twice with 60 ml of water. After extracting twice from the aqueous phase with 60 ml of diethyl ether, the entire organic phase was dried over magnesium sulfate. The solvent was distilled off, and the residue was purified by silica gel column chromatography (developing solvent: hexane) to obtain 11 g of m-tolyl(p-bromophenyl)phenylamine as a white solid at a yield of 84%.

In a reactor equipped with a stirrer and a reflux condenser, 2.0 g (0.0059 mol) of m-tolyl(p-bromophenyl)phenylamine, 0.18 g (0.00015 mol) of tetrakistriphenylphosphine palladium (0), 0.005 g of 2,6-dibutylhydroxytoluene and 20 ml of toluene were added and dissolved, and then 2.1 ml (0.0071 mol) of tributyl(vinyl)tin was added to the mixture in an argon gas atmosphere at room temperature. The mixture was heated to 100° C. and continuously stirred for 76 hours. After air cooling, the solvent was distilled off, and the residue was purified by silica gel column chromatography (developing solvent: hexane) to yield 1.4 g of m-tolyl(p-vinylphenyl)phenylamine as a colorless liquid at a yield of 81%.

In a glass flask equipped with an oil bath and a stirrer, 0.36 g (0.0013 mol) of m-tolyl(p-vinylphenyl)phenylamine, 0.49 g (0.0038 mol) of maleic acid monomethyl ester and 0.0021 g (0.000013 mol) of azobis(isobutyronitrile) were dissolved in 6 ml of toluene, followed by bubbling argon gas into the solution for 30 minutes, and sealing and stirring at 70° C. for 24 hours. The reaction mixture was subjected to reprecipitation purification by adding it to 30 ml of methanol to yield 0.45 g of a copolymer (b1) as a white solid.

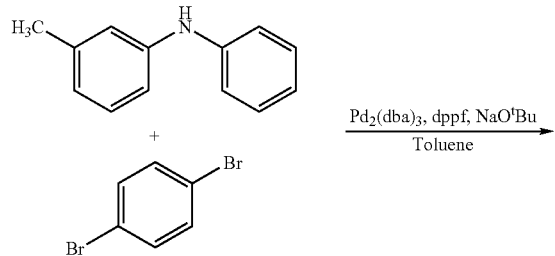

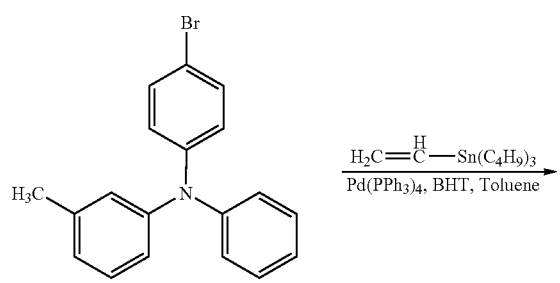

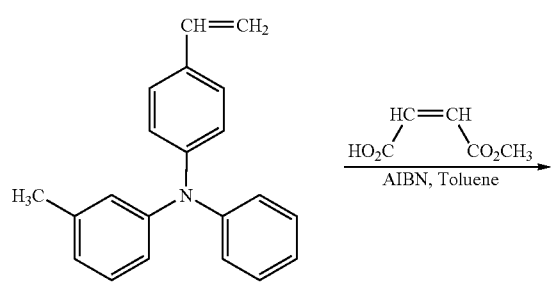

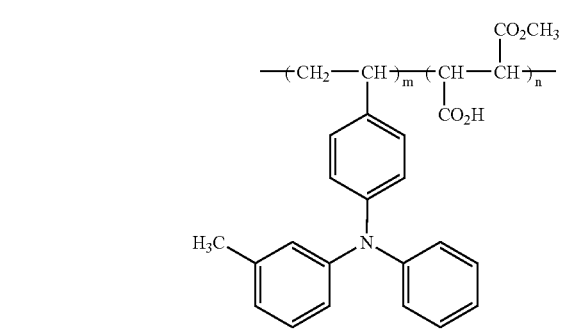

Regarding the resulting copolymer (b1) in a dichloromethane solution, an ultraviolet-visible absorption spectrum was measured. As a result, an absorption peak was observed at 302 nm. The IR characteristic absorption spectrum was measured by the KBr disk method. As a result, the copolymer had characteristic absorption of C=O stretching vibration at 1710 cm$^{-1}$ and 1740 cm$^{-1}$ and thus the presence of a carboxyl group (—COOH) and a methoxycarbonyl group (—COOCH$_3$) was confirmed. It was estimated by measuring using an in-air photoelectron spectrometer "AC-1" manufactured by RIKEN KEIKI CO., LTD., that an ionization potential (Ip) is 5.62 eV.

Synthesis Example 2

Synthesis of Copolymer (b2)

In a reactor equipped with a stirrer, 0.36 g (0.0013 mol) of m-tolyl(p-vinylphenyl)phenylamine synthesized in Synthesis Example 1, 0.54 g (0.0037 mol) of itaconic acid monomethyl ester, 0.0020 g (0.000012 mol) of azobis(isobutyronitrile) and 5 ml of toluene were added, followed by bubbling argon gas for 30 minutes, and sealing and stirring at 70° C. for 24 hours. The reaction mixture was subjected to reprecipitation purification by adding it to 30 ml of methanol to yield 0.48 g of a copolymer (b2) as a white solid.

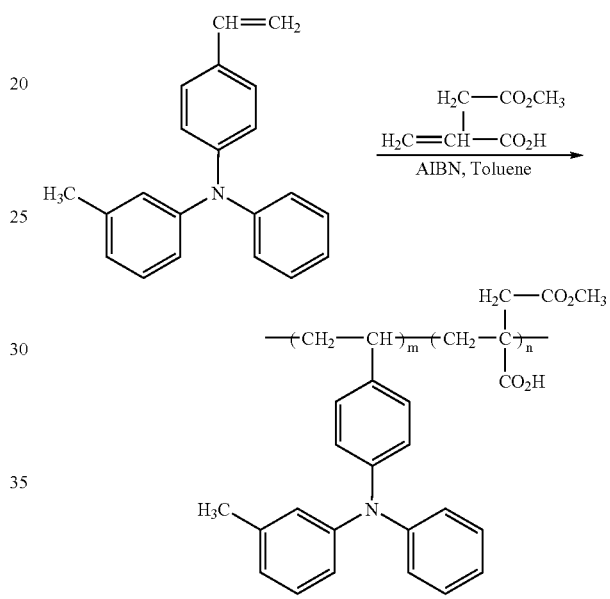

Regarding the resulting copolymer (b2) in a dichloromethane solution, an ultraviolet-visible absorption spectrum was measured. As a result, an absorption peak was observed at 302 nm. The IR characteristic absorption spectrum was measured by the KBr disk method. As a result, the copolymer had characteristic absorption of C=O stretching vibration at 1709 cm$^{-1}$ and 1742 cm$^{-1}$ and thus the presence of a carboxyl group (—COOH) and a methoxycarbonyl group (—COOCH$_3$) was confirmed. It was estimated by measuring in the same way as in Example 1 that Ip is 5.62 eV.

Synthesis Example 3

Synthesis of Copolymer (b3)

In a reactor equipped with a stirrer, 0.36 g (0.0013 mol) of m-tolyl(p-vinylphenyl)phenylamine synthesized in Synthesis Example 1, 0.34 g (0.0035 mol) of maleic anhydride, 0.0021 g (0.000013 mol) of azobis(isobutyronitrile) and 5 ml of toluene were added, followed by bubbling argon gas for 30 minutes, and sealing and stirring at 70° C. for 24 hours. The reaction mixture was subjected to reprecipitation purification by adding it to 30 ml of methanol to yield 0.45 g of a copolymer (b3) as a white solid.

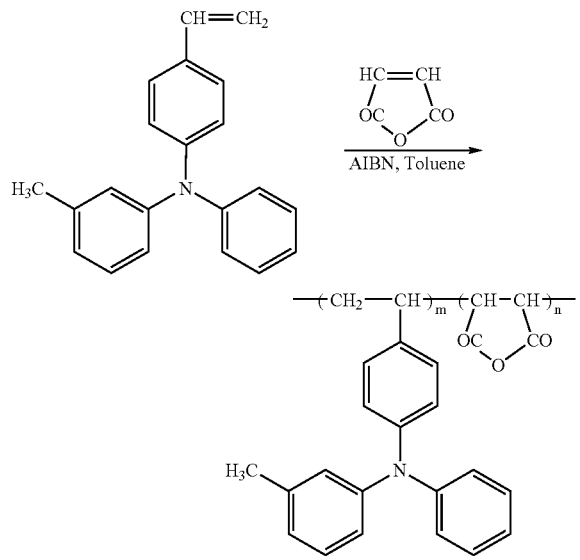

Regarding the resulting copolymer (b3) in a dichloromethane solution, an ultraviolet-visible absorption spectrum was measured. As a result, an absorption peak was observed at 302 nm. The IR characteristic absorption spectrum was measured by the KBr disk method. As a result, the copolymer had characteristic absorption of C=O stretching vibration at 1781 cm$^{-1}$ and 1860 cm$^{-1}$ and thus the presence of a carboxylic anhydride structure (—CO—O—CO—) was confirmed. It was estimated by measuring in the same way as in Example 1 that Ip is 5.64 eV.

Synthesis Example 4

Synthesis of Copolymer (b4)

In a reactor equipped with a stirrer, 0.36 g (0.0013 mol) of m-tolyl(p-vinylphenyl)phenylamine synthesized in Synthesis Example 1, 0.38 g (0.0034 mol) of itaconic anhydride, 0.0022 g (0.000013 mol) of azobis(isobutyronitrile) and 5 ml of toluene were added, followed by bubbling argon gas for 30 minutes, and sealing and stirring at 70° C. for 24 hours. The reaction mixture was subjected to reprecipitation purification by adding it to 30 ml of methanol to yield 0.48 g of a copolymer (b4) as a white solid.

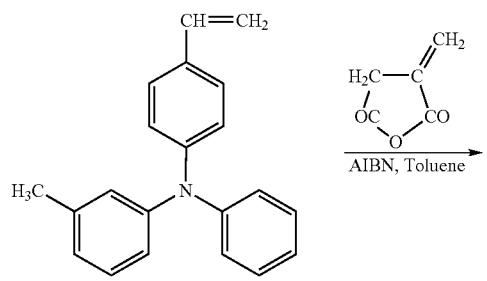

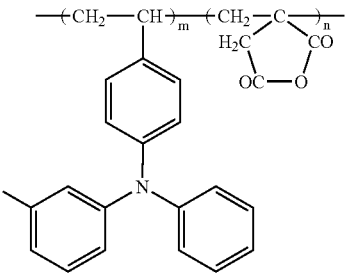

Regarding the resulting copolymer (b4) in a dichloromethane solution, an ultraviolet-visible absorption spectrum was measured. As a result, an absorption peak was observed at 302 nm. The IR characteristic absorption spectrum was measured by the KBr disk method. As a result, the copolymer had characteristic absorption of C=O stretching vibration at 1782 cm$^{-1}$ and 1860 cm$^{-1}$ and thus the presence of a carboxylic anhydride structure (—CO—O—CO—) was confirmed. It was estimated by measuring in the same way as in Example 1 that Ip is 5.63 eV.

Synthesis Example 5

Synthesis of Copolymer (b5)

In a reactor equipped with a stirrer and a reflux condenser, 26 g (0.082 mol) of 4,4'-dibromobiphenyl, 0.38 g (0.00041 mol) of tris(dibenzylideneacetone)dipalladium (0), 0.34 g (0.00061 mol) of 1,1'-bis(diphenylphosphino)ferrocene and 150 ml of toluene were added, followed by stirring in an argon gas atmosphere at room temperature for 15 minutes.

To the mixture, 3.9 g (0.041 mol) of sodium-tert-butoxide and 5.0 g (0.027 mol) of m-tolylphenylamine were added and, after heating to 95° C., the mixture was continuously stirred for 24 hours. After air cooling, 150 ml of water and 100 ml of diethyl ether were added to the mixture and the separated organic phase was washed twice with 100 ml of water. After extracting twice from the aqueous phase with 100 ml of diethyl ether, the entire organic phase was dried over magnesium sulfate. The solvent was distilled off, and the residue was purified by silica gel column chromatography (developing solvent: hexane) to yield 9.3 g of 4-bromo-4'-(m-tolylphenylamino)biphenyl as a white solid at a yield of 68%.

In a reactor equipped with a stirrer and a reflux condenser, 8.5 g (0.021 mol) of 4-bromo-4'-(m-tolylphenylamino)biphenyl, 0.29 g (0.00031 mol) of tris(dibenzylideneacetone)dipalladium (0), 0.26 g (0.00047 mol) of 1,1'-bis(diphenylphosphino)ferrocene and 120 ml of toluene were added, followed by stirring in an argon atmosphere at room temperature for 15 minutes. To the mixture, 2.4 g (0.025 mol) of sodium-tert-butoxide and 2.3 g (0.021 mol) of 3-methylaniline were added and, after heating to 95° C., the mixture was continuously stirred for 3 hours.

To the reaction mixture, 2.4 g (0.025 mol) of sodium-tert-butoxide and 15 g (0.063 mol) of 1,4-dibromobenzene were added and the mixture was continuously stirred at 95° C. for 24 hours. After air cooling, 120 ml of water and 100 ml of diethyl ether were added to the mixture and the separated organic phase was washed twice with 100 ml of water. After extracting twice from the aqueous phase with 100 ml of diethyl ether, the entire organic phase was dried over magnesium sulfate. The solvent was distilled off, and the residue was purified by silica gel column chromatography (developing solvent: hexane/toluene=4/1) to yield 8.1 g of 4-(m-tolylphenylamino)-4'-(m-tolyl-p-bromophenylamino)biphenyl as a white solid at a yield of 65%.

In a reactor equipped with a stirrer and a reflux condenser, 3.0 g (0.0050 mol) of 4-(m-tolylphenylamino)-4'-(m-tolyl-p-bromophenylamino)biphenyl, 0.15 g (0.00013 mol) of tetrakistriphenylphosphine palladium (0), 0.004 g of 2,6-dibutylhydroxytoluene and 30 ml of toluene. To the mixture, 1.8 ml (0.0060 mol) of tributyl(vinyl)tin was added in an argon gas atmosphere at room temperature.

The mixture was heated to 100° C. and continuously stirred for 48 hours. After air cooling, the solvent was distilled off and silica gel column chromatography (developing solvent: hexane/ethyl acetate=19/1) to yield 2.2 g of 4-(m-tolylphenylamino)-4'-(m-tolyl-p-vinylphenylamino) biphenyl as a colorless liquid at a yield of 80%.

In a glass flask equipped with an oil bath and a stirrer, 0.70 g (0.0013 mol) of 4-(m-tolylphenylamino)-4'-(m-tolyl-p-vinylphenylamino)biphenyl, 0.49 g (0.0038 mol) of maleic acid monomethyl ester and 0.0021 g (0.000013 mol) of azobis(isobutyronitrile) were dissolved in 12 ml of toluene, followed by bubbling argon gas into the solution for 30 minutes, and sealing and stirring at 70° C. for 24 hours. The reaction mixture was subjected to reprecipitation purification by adding it to 40 ml of methanol to yield 0.61 g of a copolymer (b5) as a white solid.

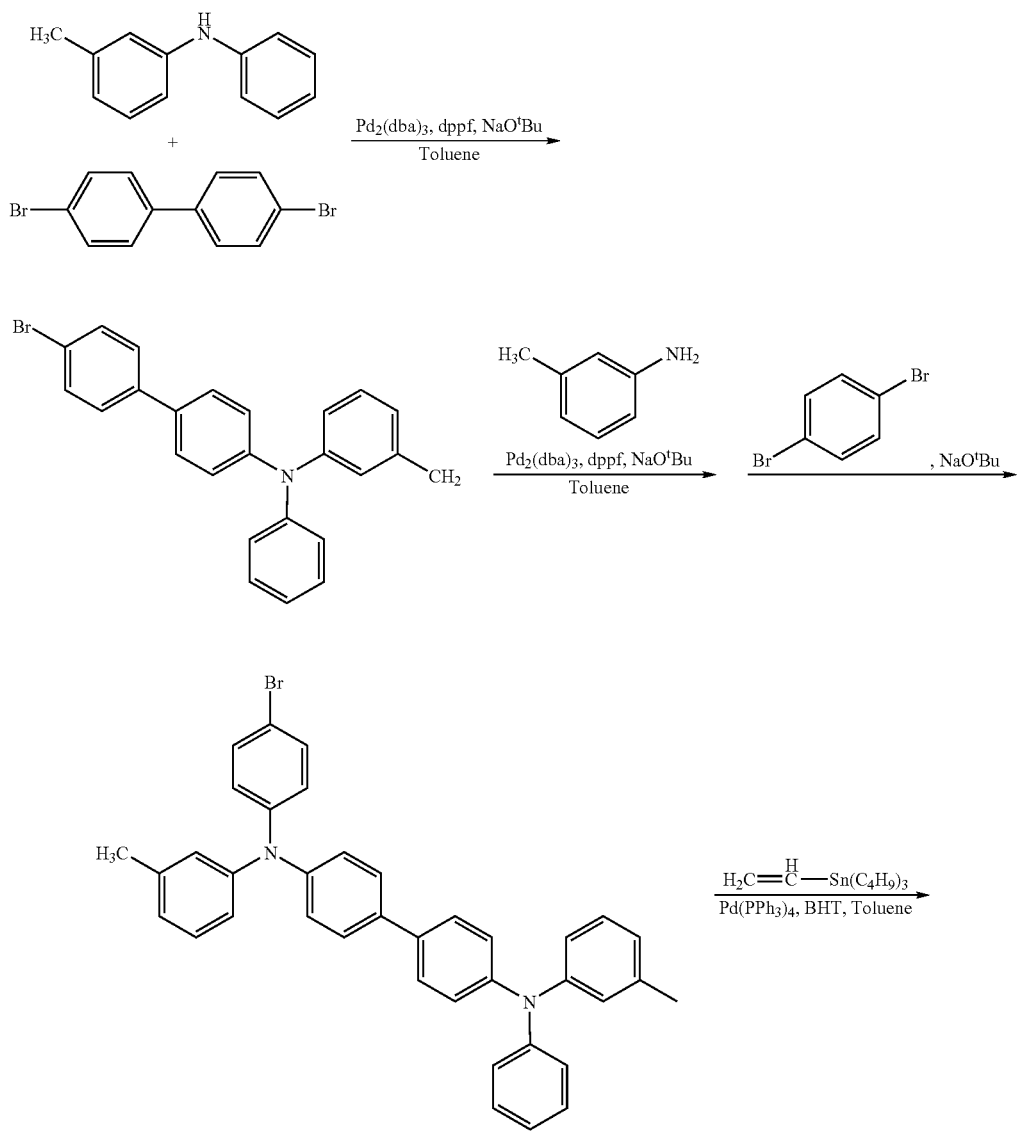

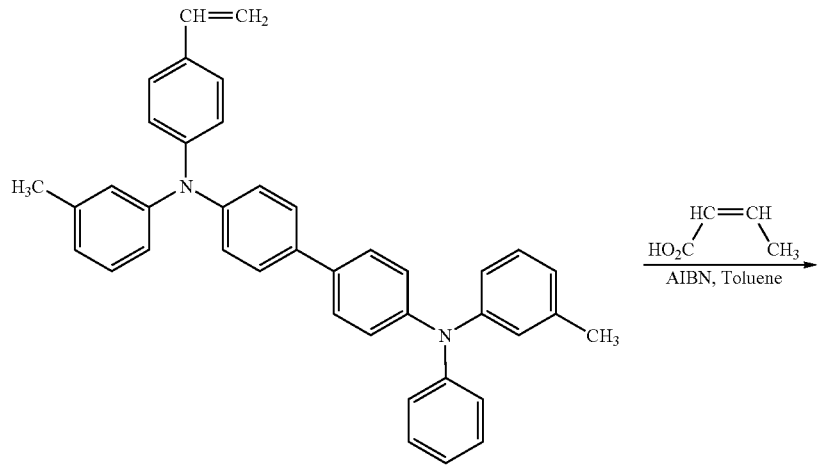

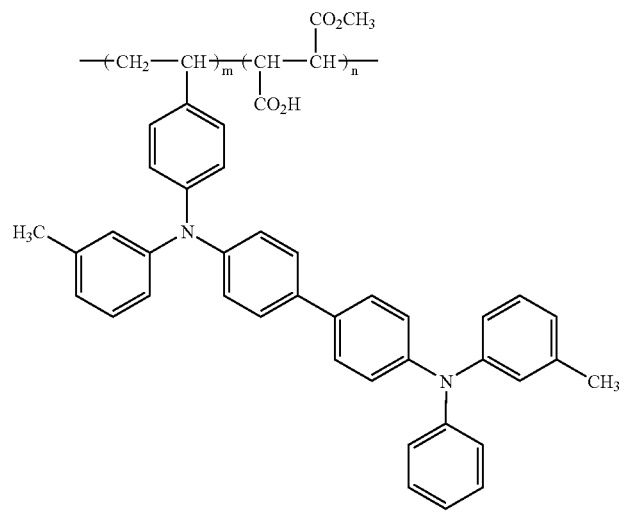

Regarding the resulting copolymer (b5) in a dichloromethane solution, an ultraviolet-visible absorption spectrum was measured. As a result, absorption peaks were observed at 356 nm and 310 nm. The IR characteristic absorption spectrum was measured by the KBr disk method. As a result, the copolymer had characteristic absorption of C=O stretching vibration at 1708 cm$^{-1}$ and 1736 cm$^{-1}$ and thus the presence of a carboxyl group (—COOH) and a methoxycarbonyl group (—COOCH$_3$) was confirmed. It was estimated by measuring in the same way as in Example 1 that Ip is 5.38 eV.

Synthesis Example 6

Synthesis of Copolymer (b6)

In a reactor equipped with a stirrer, 0.70 g (0.0013 mol) of 4-(m-tolylphenylamino)-4'-(m-tolyl-p-vinylphenylamino)biphenyl synthesized in Synthesis Example 7, 0.60 g (0.0038 mol) of 2,3-dimethylmaleic acid monomethyl ester synthesized in Synthesis Example 2, 0.0021 g (0.000013 mol) of 2,2'-azobis(isobutyronitrile) and 12 ml of toluene were added, followed by bubbling argon gas into the solution for 30 minutes, and sealing and stirring at 70° C. for 24 hours. The reaction mixture was subjected to reprecipitation purification by adding it to 40 ml of methanol to yield 0.67 g of a copolymer (b6) as a white solid.

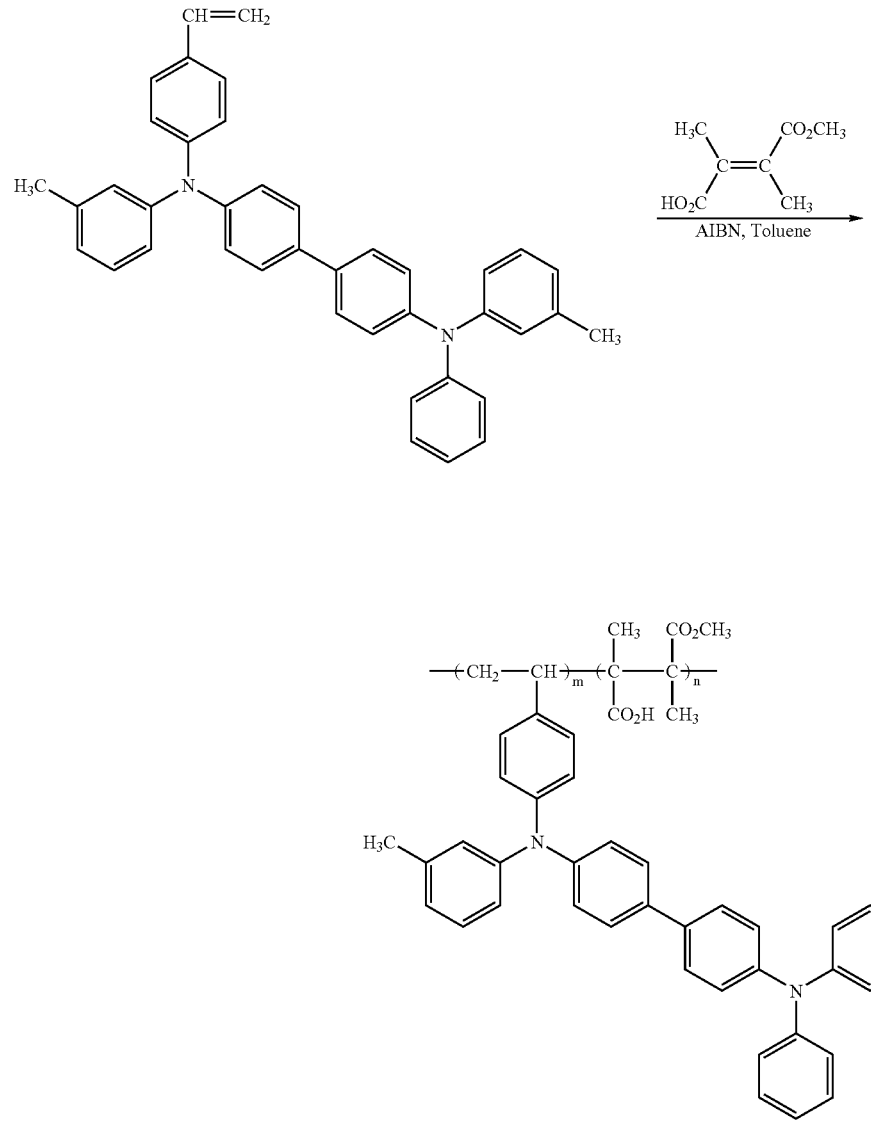

Regarding the resulting copolymer (b6) in a dichloromethane solution, an ultraviolet-visible absorption spectrum was measured. As a result, absorption peaks were observed at 355 nm and 310 nm. The IR characteristic absorption spectrum was measured by the KBr disk method. As a result, the copolymer had characteristic absorption of C=O stretching vibration at 1709 cm$^{-1}$ and 1743 cm$^{-1}$ and thus the presence of a carboxyl group (—COOH) and a methoxycarbonyl group (—COOCH$_3$) was confirmed. It was estimated by measuring in the same way as in Example 1 that Ip is 5.39 eV.

Synthesis Example 7

Synthesis of Copolymer (b7)

In a reactor equipped with a stirrer, 0.70 g (0.0013 mol) of 4-(m-tolylphenylamino)-4'-(m-tolyl-p-vinylphenylamino)biphenyl synthesized in Synthesis Example 7, 0.55 g (0.0038 mol) of itaconic acid monomethyl ester, 0.0021 g (0.000013 mol) of 2,2'-azobis(isobutyronitrile) and 15 ml of toluene were added, followed by bubbling argon gas into the solution for 30 minutes, and sealing and stirring at 70° C. for 24 hours. The reaction mixture was subjected to reprecipitation purification by adding it to 45 ml of methanol to yield 0.62 g of a copolymer (b7) as a white solid.

thus the presence of a carboxyl group (—COOH) and a methoxycarbonyl group (—COOCH$_3$) was confirmed. It was estimated by measuring in the same way as in Example 1 that Ip is 5.39 eV.

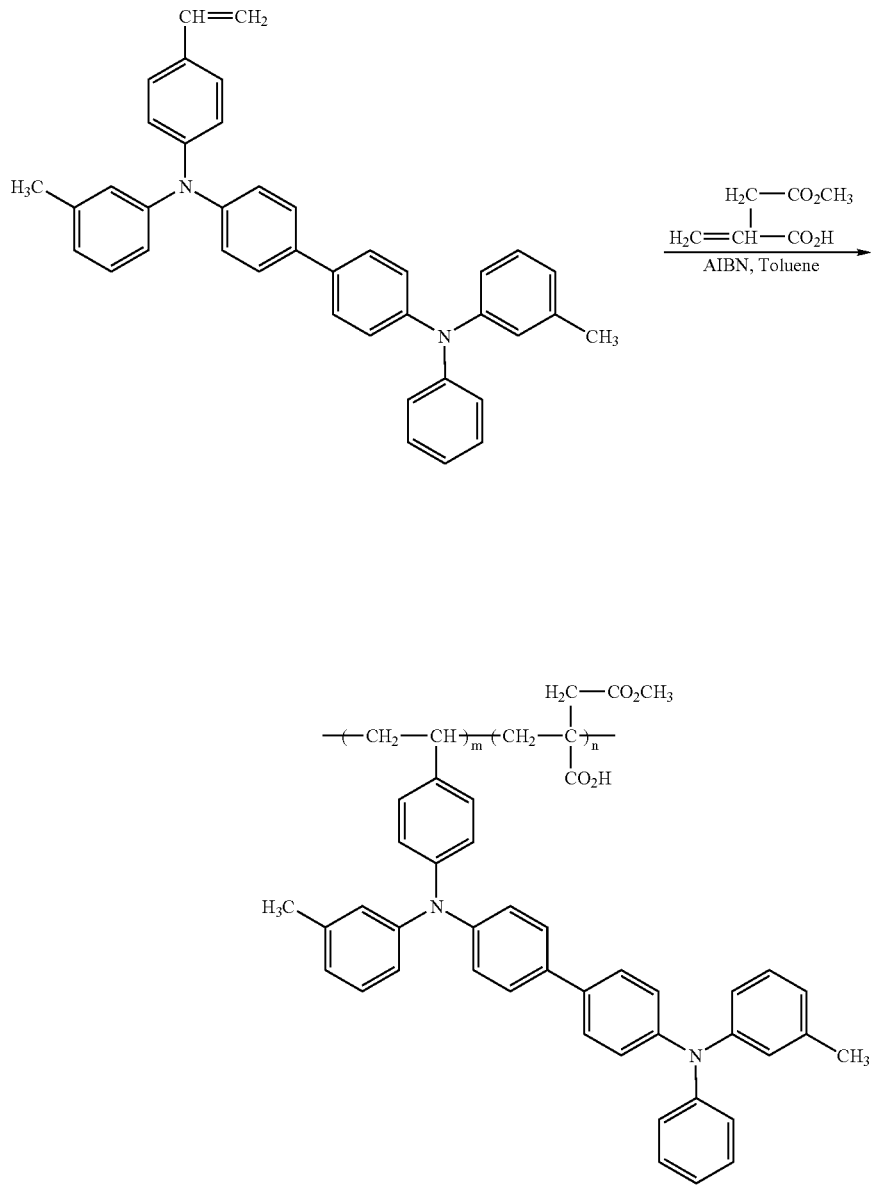

Regarding the resulting copolymer (b7) in a dichloromethane solution, an ultraviolet-visible absorption spectrum was measured. As a result, absorption peaks were observed at 357 nm and 310 nm. The IR characteristic absorption spectrum was measured by the KBr disk method. As a result, the copolymer had characteristic absorption of C=O stretching vibration at 1711 cm$^{-1}$ and 1739 cm$^{-1}$ and Synthesis Example 8

Synthesis of Copolymer (b8)

In a reactor equipped with a stirrer, 0.70 g (0.0013 mol) of 4-(m-tolylphenylamino)-4'-(m-tolyl-p-vinylphenylamino)biphenyl synthesized in Synthesis Example 7, 0.37 g (0.0038 mol) of maleic anhydride, 0.0021 g (0.000013 mol)

of 2,2'-azobis(isobutyronitrile) and 12 ml of toluene were added, followed by bubbling argon gas into the solution for 30 minutes, and sealing and stirring at 70° C. for 24 hours. The reaction mixture was subjected to reprecipitation purification by adding it to 40 ml of methanol to yield 0.61 g of a copolymer (b8) as a white solid.

mol) of 2,2'-azobis(isobutyronitrile) and 14 ml of toluene were added, followed by bubbling argon gas into the solution for 30 minutes, and sealing and stirring at 70° C. for 24 hours. The reaction mixture was subjected to reprecipitation purification by adding it to 40 ml of methanol to yield 0.62 g of a copolymer (b9) as a white solid.

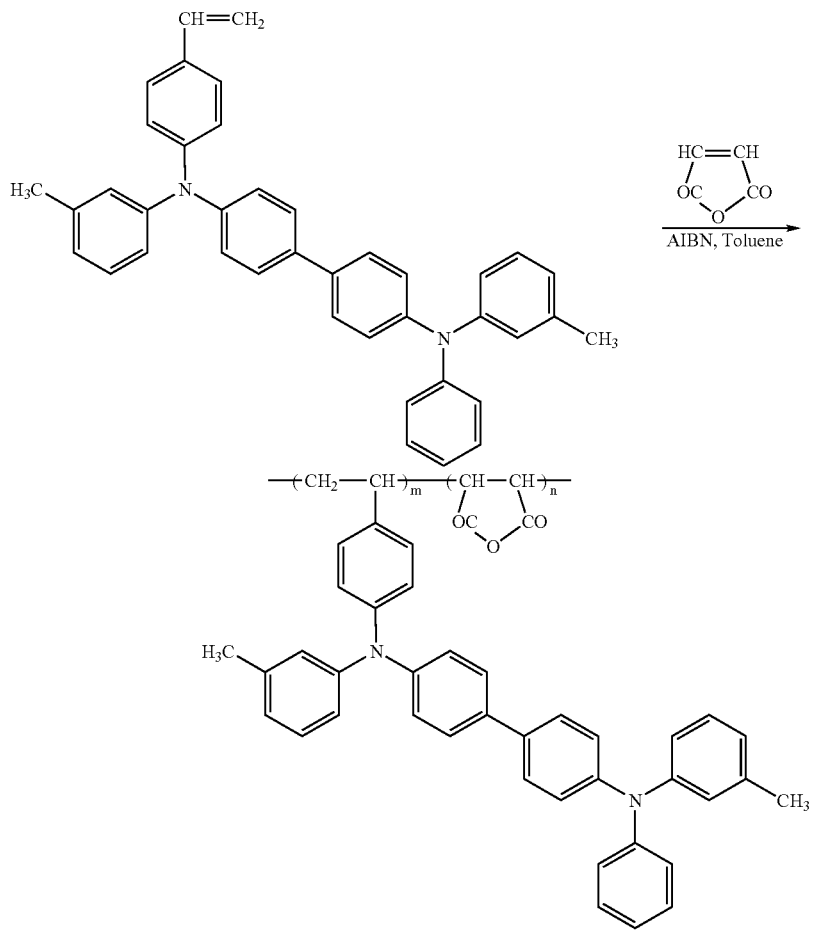

Regarding the resulting copolymer (b8) in a dichloromethane solution, an ultraviolet-visible absorption spectrum was measured. As a result, absorption peaks were observed at 355 nm and 310 nm. The IR characteristic absorption spectrum was measured by the KBr disk method. As a result, the copolymer had characteristic absorption of C=O stretching vibration at 1780 cm$^{-1}$ and 1858 cm$^{-1}$ and thus the presence of a carboxylic anhydride structure (—CO—O—CO—) was confirmed. It was estimated by measuring in the same way as in Example 1 that Ip is 5.40 eV.

Synthesis Example 9

Synthesis of Copolymer (b9)

In a reactor equipped with a stirrer, 0.70 g (0.0013 mol) of 4-(m-tolylphenylamino)-4'-(m-tolyl-p-vinylphenylamino)biphenyl synthesized in Synthesis Example 7, 0.43 g (0.0038 mol) of itaconic anhydride, 0.0022 g (0.000013

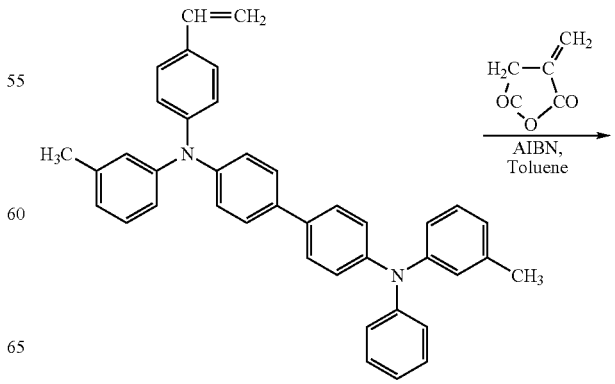

-continued

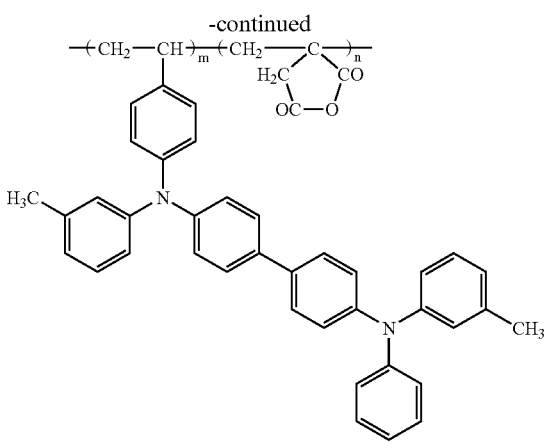

Regarding the resulting copolymer (b9) in a dichloromethane solution, an ultraviolet-visible absorption spectrum was measured. As a result, absorption peaks were observed at 355 nm and 310 nm. The IR characteristic absorption spectrum was measured by the KBr disk method. As a result, the copolymer had characteristic absorption of C=O stretching vibration at 1781 cm$^{-1}$ and 1859 cm$^{-1}$ and thus the presence of a carboxylic anhydride structure (—CO—O—CO—) was confirmed. It was estimated by measuring in the same way as in Example 1 that Ip is 5.40 eV.

Synthesis Example 10

Synthesis of Copolymer (b10)

In a glass flask equipped with an oil bath, a stirrer and a reflux condenser, 3.8 g (0.022 mol) of 3-bromotoluene, 0.31 g (0.00033 mol) of tris(dibenzylideneacetone)dipalladium (0) and 0.28 g (0.00049 mol) of 1,1'-bis(diphenylphosphino)ferrocene were added to 200 ml of toluene, followed by stirring in an argon gas atmosphere at room temperature for 15 minutes.

To the reaction mixture, 2.6 g (0.028 mol) of sodium-tert-butoxide and 2.7 g (0.022 mol) of p-methoxyaniline were added and, after heating to an oil bath temperature of 95° C., the mixture was continuously stirred for 3 hours. Then, 2.6 g (0.028 mol) of sodium-tert-butoxide and 21 g (0.071 mol) of 4,4'-dibromobiphenyl were added and the mixture was continuously stirred at an oil bath temperature of 95° C. for 20 hours.

After air cooling, 150 ml of water and 100 ml of diethyl ether were added to the mixture and the separated organic phase was washed twice with 100 ml of water. After extracting twice from the aqueous phase with 100 ml of diethyl ether, the entire organic phase was dried over magnesium sulfate. The solvent was distilled off, and the residue was purified by silica gel column chromatography (developing solvent: hexane) to yield 9.0 g of 4-bromo-4'-(m-tolyl-p-methoxyphenylamino)biphenyl as a white solid at a yield of 79%.

In a glass flask equipped with an oil bath, a stirrer and a reflux condenser, 8.0 g (0.018 mol) of 4-bromo-4'-(m-tolyl-p-methoxyphenylamino)biphenyl, 0.25 g (0.00026 mol) of tris(dibenzylideneacetone)dipalladium (0) and 0.22 g (0.00040 mol) of 1,1'-bis(diphenylphosphino)ferrocene were added to 120 ml of toluene, followed by stirring in an argon gas atmosphere at room temperature for 15 minutes.

To the reaction mixture, 2.1 g (0.022 mol) of sodium-tert-butoxide and 2.5 g (0.018 mol) of p-methoxyaniline were added and, after heating to an oil bath temperature of 95° C., the mixture was continuously stirred for 3 hours. To the reaction mixture, 2.1 g (0.022 mol) of sodium-tert-butoxide and 13 g (0.054 mol) of 1,4-dibromobenzene were added and the mixture was continuously stirred at an oil bath temperature of 95° C. for 22 hours.

After air cooling, 120 ml of water and 100 ml of diethyl ether were added to the mixture and the separated organic phase was washed twice with 100 ml of water. After extracting twice from the aqueous phase with 100 ml of diethyl ether, the entire organic phase was dried over magnesium sulfate. The solvent was distilled off, and the residue was purified by silica gel column chromatography (developing solvent: hexane/toluene=4/1)) to yield 7.2 g of 4-(m-tolyl-p-methoxyphenylamino)-4'-(p-methoxyphenyl-p-bromophenylamino)biphenyl as a white solid at a yield of 67%.

In a glass flask equipped with an oil bath, a stirrer and a reflux condenser, 3.0 g (0.0045 mol) of 4-(m-tolyl-p-methoxyphenylamino)-4'-(p-methoxyphenyl-p-bromophenylamino)biphenyl, 0.14 g (0.00012 mol) of tetrakistriphenylphosphine palladium (0) and 0.004 g of 2,6-dibutylhydroxytoluene in 30 ml of toluene and 1.6 ml (0.0054 mol) of tributyl(vinyl)tin was added to the reaction mixture in an argon gas atmosphere at room temperature.

The reaction mixture was heated to 100° C. and then continuously stirred for 48 hours. After air cooling, the solvent was distilled off, and the residue was purified by silica gel column chromatography (developing solvent: hexane/ethyl acetate=9/1) to yield 2.2 g of 4-(m-tolyl-p-methoxyphenylamino)-4'-(p-methoxyphenyl-p-vinylphenylamino)biphenyl as a colorless liquid at a yield of 81%.

In a glass flask equipped with an oil bath and a stirrer, 0.75 g (0.0012 mol) of 4-(m-tolyl-p-methoxyphenylamino)-4'-(p-methoxyphenyl-p-vinylphenylamino)biphenyl, 1.1 g (0.0083 mol) of maleic acid monomethyl ester and 0.0024 g (0.000015 mol) of azobis(isobutyronitrile) were dissolved in 15 ml of toluene, followed by bubbling argon gas into the solution for 30 minutes, and sealing and stirring at 70° C. for 24 hours. The reaction mixture was subjected to reprecipitation purification by adding it to 50 ml of methanol to yield 0.73 g of a copolymer (b10) as a white solid.

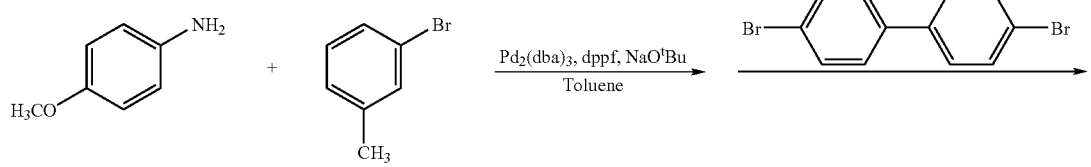

-continued
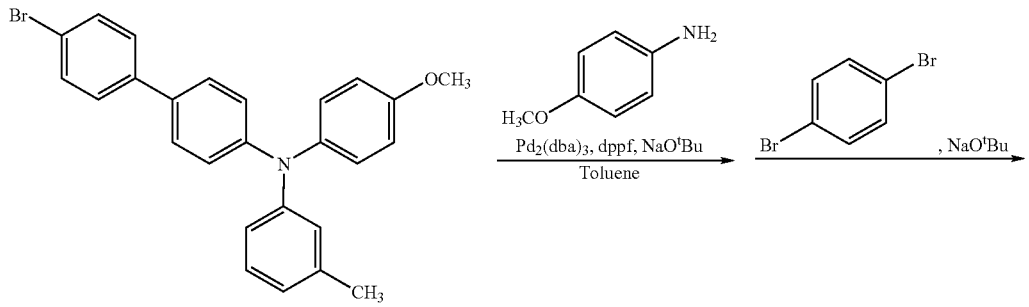
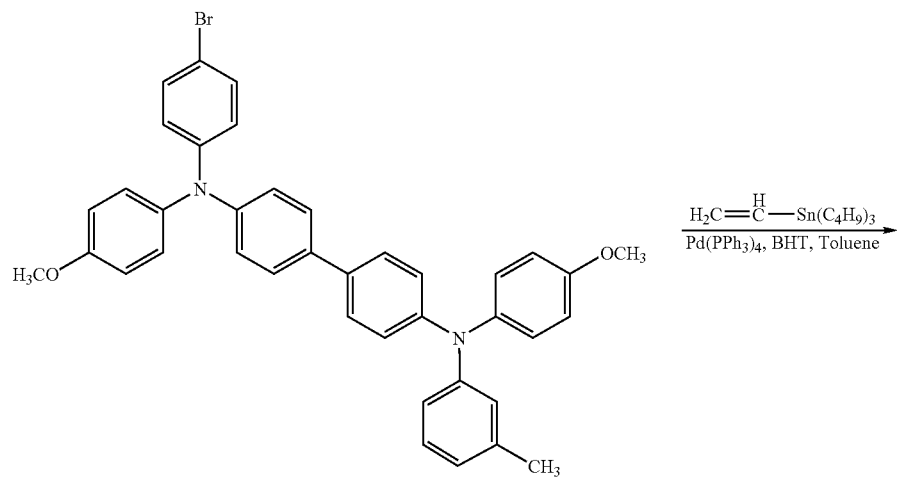
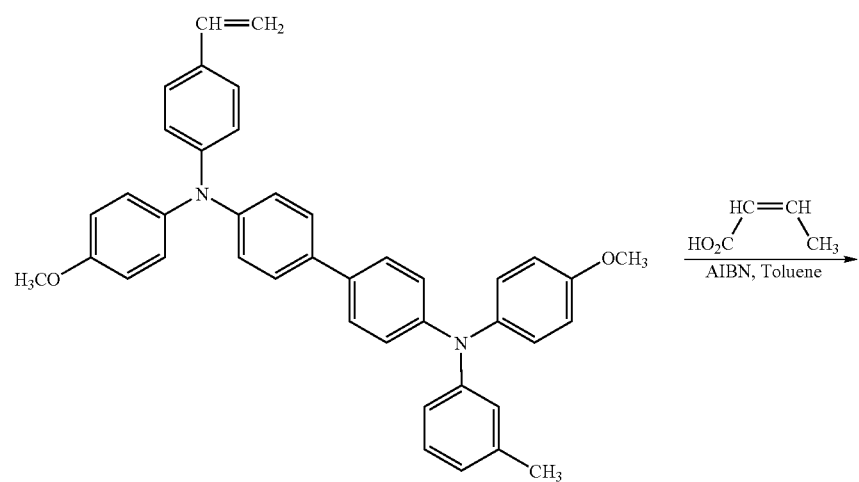

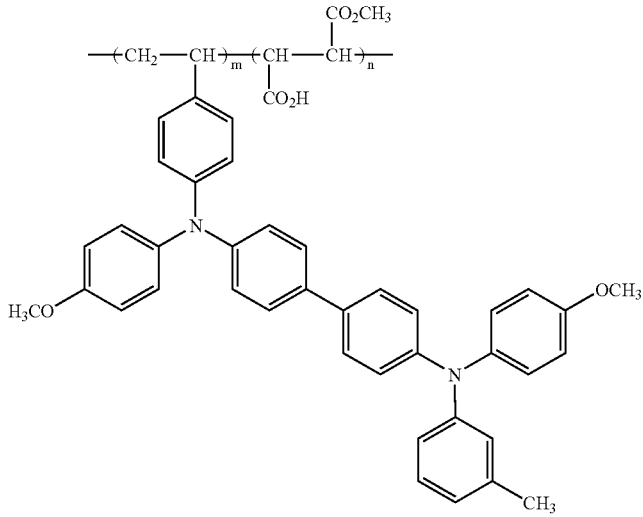

Regarding the resulting copolymer (b10) in a dichloromethane solution, an ultraviolet-visible absorption spectrum was measured. As a result, absorption peaks were observed at 361 nm and 312 nm. The IR characteristic absorption spectrum was measured by the KBr disk method. As a result, the copolymer had characteristic absorption of C=O stretching vibration at 1705 cm$^{-1}$ and 1737 cm$^{-1}$ and thus the presence of a carboxylic anhydride structure (—CO—O—CO—) was confirmed. It was estimated by measuring in the same way as in Example 1 that Ip is 5.08 eV.

Synthesis Example 11

Synthesis of Copolymer (b11)

In a glass flask equipped with an oil bath, a stirrer and a reflux condenser, 4.0 g (0.023 mol) of 3-bromotoluene, 0.33 g (0.00035 mol) of tris(dibenzylideneacetone)dipalladium (0) and 0.29 g (0.00051 mol) of 1,1'-bis(diphenylphosphino)ferrocene were added to 200 ml of toluene, followed by stirring in an argon gas atmosphere at room temperature for 15 minutes.

To the reaction mixture, 2.7 g (0.030 mol) of sodium-tert-butoxide and 2.5 g (0.023 mol) of m-fluoroaniline were added and, after heating to an oil bath temperature of 95° C., the mixture was continuously stirred for 3 hours. Then, 2.7 g (0.030 mol) of sodium-tert-butoxide and 22 g (0.075 mol) of 4,4'-dibromobiphenyl were added and the mixture was continuously stirred at an oil bath temperature of 95° C. for 21 hours.

After air cooling, 150 ml of water and 100 ml of diethyl ether were added to the mixture and the separated organic phase was washed twice with 100 ml of water. After extracting twice from the aqueous phase with 100 ml of diethyl ether, the entire organic phase was dried over magnesium sulfate. The solvent was distilled off, and the residue was purified by silica gel column chromatography (developing solvent: hexane) to yield 8.1 g of 4-bromo-4'-(m-tolyl-m-fluorophenylamino)biphenyl as a white solid at a yield of 83%.

In a glass flask equipped with an oil bath, a stirrer and a reflux condenser, 7.5 g (0.018 mol) of 4-bromo-4'-(m-tolyl-m-fluorophenylamino)biphenyl, 0.25 g (0.00026 mol) of tris(dibenzylideneacetone)dipalladium (0) and 0.22 g (0.00040 mol) of 1,1'-bis(diphenylphosphino)ferrocene were added to 120 ml of toluene, followed by stirring in an argon gas atmosphere at room temperature for 15 minutes.

To the reaction mixture, 2.1 g (0.022 mol) of sodium-tert-butoxide and 2.0 g (0.018 mol) of m-fluoroaniline were added and, after heating to an oil bath temperature of 95° C., the mixture was continuously stirred for 3 hours. To the reaction mixture, 2.1 g (0.022 mol) of sodium-tert-butoxide and 13 g (0.054 mol) of 1,4-dibromobenzene were added and the mixture was continuously stirred at an oil bath temperature at 95° C. for 22 hours.

After air cooling, 120 ml of water and 100 ml of diethyl ether were added to the mixture and the separated organic phase was washed twice with 100 ml of water. After extracting twice from the aqueous phase with 100 ml of diethyl ether, the entire organic phase was dried over magnesium sulfate. The solvent was distilled off, and the residue was purified by silica gel column chromatography (developing solvent: hexane→hexane/ethyl acetate=9/1) to yield 8.0 g of 4-(m-tolyl-m-fluorophenylamino)-4'-(m-fluorophenyl-p-bromophenylamino)biphenyl as a white solid at a yield of 70%.

In a glass flask equipped with an oil bath, a stirrer and a reflux condenser, 3.0 g (0.0047 mol) of 4-(m-tolyl-m-fluorophenylamino)-4'-(m-fluorophenyl-p-bromophenylamino)biphenyl, 0.15 g (0.00013 mol) of tetrakistriphenylphosphine palladium (0) and 0.004 g of 2,6-dibutylhydroxytoluene were dissolved in 30 ml of toluene and 1.7 ml (0.0056 mol) of tributyl(vinyl)tin was added to the reaction mixture in an argon gas atmosphere at room temperature.

The reaction mixture was heated to 100° C. and then continuously stirred for 48 hours. After air cooling, the solvent was distilled off, and the residue was purified by silica gel column chromatography (developing solvent: hexane/toluene=4/1) to yield 2.1 g of 4-(m-tolyl-m-fluorophenylamino)-4'-(m-fluorophenyl-p-vinylphenylamino)biphenyl as a colorless liquid at a yield of 78%.

In a glass flask equipped with an oil bath and a stirrer, 0.72 g (0.0012 mol) of 4-(m-tolyl-m-fluorophenylamino)-4'-(m-fluorophenyl-p-vinylphenylamino)biphenyl, 1.6 g (0.012 mol) of maleic acid monomethyl ester and 0.0030 g (0.000019 mol) of azobis(isobutyronitrile) were dissolved in 20 ml of toluene, followed by bubbling argon gas into the solution for 30 minutes, and sealing and stirring at 70° C. for 24 hours. The reaction mixture was subjected to reprecipitation purification by adding it to 50 ml of methanol to yield 0.91 g of a copolymer (b11) as a white solid.
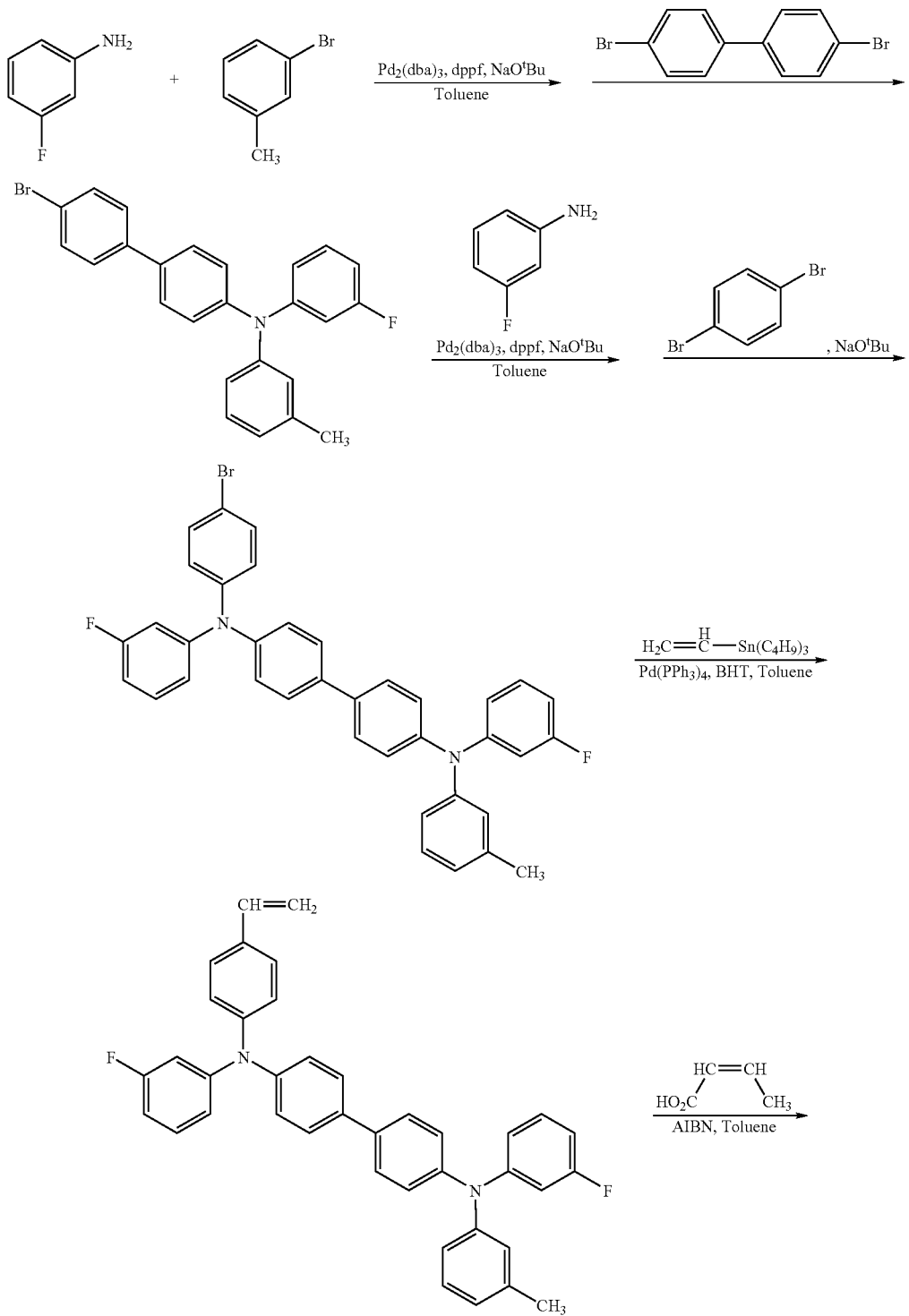

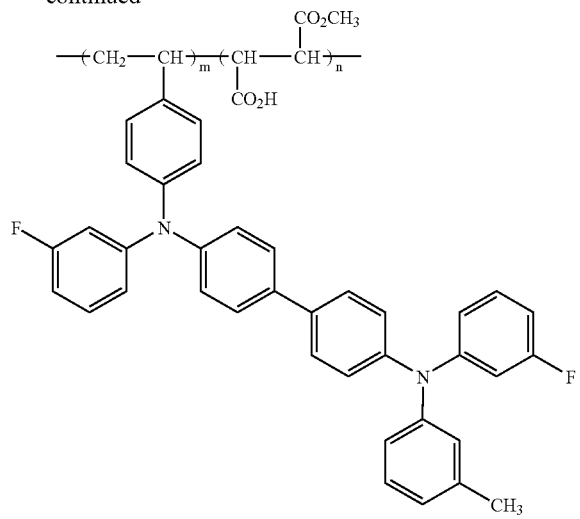

Regarding the resulting copolymer (b11) in a dichloromethane solution, an ultraviolet-visible absorption spectrum was measured. As a result, absorption peaks were observed at 352 nm and 312 nm. The IR characteristic absorption spectrum was measured by the KBr disk method. As a result, the copolymer had characteristic absorption of C=O stretching vibration at 1709 cm$^{-1}$ and 1738 cm$^{-1}$ and thus the presence of a carboxylic anhydride structure (—CO—O—CO—) was confirmed. It was estimated by measuring in the same way as in Example 1 that Ip is 5.57 eV.

With respect to the copolymers (b1) to (b11) obtained in Synthesis Example 1 to 11, elemental analysis and measurement of the molecular weight were conducted. The results are shown in Table 1 and Table 2.

(A) Elemental Analysis

The amounts of the respective elements C, H and N in the resulting copolymers were measured by elemental analysis. The results were compared with the results of the calculation of the respective elements C, H and N, provided that m/n (number-average value) in the table is a ratio of m to n of the copolymer.

(B) Analytical Results of Gel Permeation Chromatography

The weight-average molecular weight (hereinafter abbreviated to "Mw"), the number-average molecular weight (hereinafter abbreviated to "Mn") and the polydispersity (hereinafter abbreviated to "Mw/Mn") (relative to polystyrene standards) were determined by gel permeation chromatography.

TABLE 1

Copolymer Elemental Analysis Results

| | Results of elemental analysis | Results of calculation of element content | m/n |
|---|---|---|---|
| Synthesis Example 1 (b1) | C: 75.6% H: 5.8% N: 3.4% | C: 75.2% H: 6.1% N: 3.4% | 1 |
| Synthesis Example 2 (b2) | C: 75.7% H: 6.1% N: 3.4% | C: 75.5% H: 6.3% N: 3.3% | 1 |

TABLE 1-continued

Copolymer Elemental Analysis Results

| | Results of elemental analysis | Results of calculation of element content | m/n |
|---|---|---|---|
| Synthesis Example 3 (b3) | C: 78.5% H: 5.6% N: 3.6% | C: 78.3% H: 5.5% N: 3.6% | 1 |
| Synthesis Example 4 (b4) | C: 78.8% H: 5.6% N: 3.5% | C: 78.6% H: 5.8% N: 3.5% | 1 |
| Synthesis Example 5 (b5) | C: 80.6% H: 6.0% N: 4.1% | C: 80.3% H: 6.0% N: 4.2% | 1 |
| Synthesis Example 6 (b6) | C: 80.6% H: 6.4% N: 4.0% | C: 80.5% H: 6.3% N: 4.0% | 1 |
| Synthesis Example 7 (b7) | C: 80.5% H: 6.0% N: 4.2% | C: 80.4% H: 6.2% N: 4.1% | 1 |
| Synthesis Example 8 (b8) | C: 82.3% H: 5.9% N: 4.3% | C: 82.5% H: 5.7% N: 4.4% | 1 |
| Synthesis Example 9 (b9) | C: 82.6% H: 5.9% N: 4.3% | C: 82.5% H: 5.8% N: 4.3% | 1 |
| Synthesis Example 10 (b10) | C: 80.0% H: 5.9% N: 4.3% | C: 79.7% H: 6.0% N: 4.3% | 1.9 |
| Synthesis Example 11 (b11) | C: 80.0% H: 5.3% N: 4.5% | C: 80.2% H: 5.3% N: 4.6% | 2.8 |

TABLE 2

Results of Copolymer Analysis by Gel Permeation Chromatography

| | Weight-average molecular weight (Mw) | Polydispersity (Mw/Mn) |
|---|---|---|
| Synthesis Example 1 (b1) | 34000 | 2.63 |
| Synthesis Example 2 (b2) | 32000 | 2.56 |
| Synthesis Example 3 (b3) | 32000 | 2.55 |
| Synthesis Example 4 (b4) | 28000 | 2.45 |
| Synthesis Example 5 (b5) | 25000 | 2.71 |

TABLE 2-continued

Results of Copolymer Analysis by Gel Permeation Chromatography

|  | Weight-average molecular weight (Mw) | Polydispersity (Mw/Mn) |
| --- | --- | --- |
| Synthesis Example 6 (b6) | 24000 | 2.18 |
| Synthesis Example 7 (b7) | 26000 | 2.84 |
| Synthesis Example 8 (b8) | 27000 | 2.44 |
| Synthesis Example 9 (b9) | 24000 | 2.4 |
| Synthesis Example 10 (b10) | 29000 | 2.28 |
| Synthesis Example 11 (b11) | 24000 | 2.48 |

It was confirmed by Synthesis Example 1 to 11 and the results shown in Table 1 and Table 2 that the respective copolymers shown in reaction paths are obtained in the respective Synthesis Examples.

Example 1

Production of Organic Electroluminescent Device (1)

A glass transparent support comprising an indium tin oxide (ITO) layer having a surface resistance value of 10 Ω/□ formed on the surface was dipped in a 5 mmol/L methanol solution of 3-aminopropyltrimethoxysilane at 50° C. for 3 hours, ultrasonically cleaned in methanol and then heated in a constant-temperature bath at 100° C. under reduced pressure (0.01 Pa or less) for one hour (step (I)).

The transparent support was cleaned by dipping in a 1 mmol (repeating unit)/L 2-butanone solution of the copolymer (b1) obtained in Synthesis Example 1 at room temperature for 30 minutes and repeatedly dipping in 2-butanone and was then blow-dried using nitrogen gas (step (II)).

Subsequently, the transparent support was cleaned by dipping in a 25 mmol/L toluene solution of ethylenediamine at room temperature for 30 minutes and repeatedly dipping in toluene and was then blow-dried using nitrogen gas. Furthermore, the transparent support was heated in a constant-temperature bath at 180° C. under reduced pressure (0.01 Pa or less) for 6 hours (step (III)).

Furthermore, the operations of the steps (II) and (III) were repeated 15 times to produce a hole transport layer (1) composed of a multi-layered thin film containing the copolymer (b1) as a constituent element. It was confirmed by the measurement of the IR characteristic absorption spectrum of the resulting hole transport layer (1) that it has C=O stretching vibration, an imide bond and an amide bond.

The film thickness of the resulting hole transport layer (1) was measured by using an automatic ellipsometer "MARY-102" manufactured by Photo Device Co. Using a scanning probe microscope "SPI3700" manufactured by Seiko Instruments Inc., the root-mean-square surface roughness ($R_{ms}$ value) determined by the measurement of surface profile due to contact mode was measured. These measurement results are shown in Table 3.

On the transparent support comprising the anode and the hole transport layer (1) obtained by the method described above, quinolinol aluminum complex ($Alq_3$) was vacuum-deposited at a film forming rate of 0.1 to 0.3 nm/sec to form a 60 nm thick emitter layer. Then, magnesium and silver were codeposited at a ratio of 10:1 to form a cathode made of a Mg—Ag layer having a thickness of 200 nm, thus producing an organic electroluminescent device (1).

Example 2

Production of Organic Electroluminescent Device (2)

In the same manner as in Example 1, except that the copolymer (b2) obtained in Synthesis Example 2 was used in place of the copolymer (b1) obtained in Synthesis Example 1, a hole transport layer (2) composed of a multi-layered thin film containing the copolymer (b2) as a constituent element was produced. It was confirmed by the measurement of the IR characteristic absorption spectrum of the resulting hole transport layer (2) that it has C=O stretching vibration, an imide bond and an amide bond. Also, the film thickness of the hole transport layer (2) and the root-mean-square surface roughness of the surface were measured in the same manner as in Example 1. The obtained measurement results are shown in Table 3.

On the transparent support comprising the anode and the hole transport layer (2) obtained by the method described above, quinolinol aluminum complex ($Alq_3$) was vacuum-deposited at a film forming rate of 0.1 to 0.3 nm/sec to form a 60 nm thick emitter layer. Then, magnesium and silver were codeposited at a ratio of 10:1 to form a cathode made of a Mg—Ag layer having a thickness of 200 nm, thus producing an organic electroluminescent device (2).

Example 3 to 7

Production of Organic Electroluminescent Devices (3) to (7)

In the same manner as in Example 1, except that the copolymers (b5), (b6), (b7), (b8) and (b9) obtained in Synthesis Example 5 to 9 were used in place of the copolymer (b1) obtained in Synthesis Example 1, hole transport layers (3) to (7) composed of multi-layered thin films containing the copolymers (b5), (b6), (b7), (b8) and (b9) as a constituent element were produced. It was confirmed by the measurement of the IR characteristic absorption spectrum of the resulting hole transport layers (3) to (7) that they have C=O stretching vibration, an imide bond and an amide bond. Also, the film thickness of the hole transport layers (3) to (7) and the root-mean-square surface roughness of the surface were measured in the same manner as in Example 1. The obtained measurement results are shown in Table 3.

On the transparent support comprising the anode and the hole transport layer (3), the transparent support comprising the anode and the hole transport layer (4), the transparent support comprising the anode and the hole transport layer (5), the transparent support comprising the anode and the hole transport layer (6) and the transparent support comprising the anode and the hole transport layer (7) obtained by the method described above, quinolinol aluminum complex ($Alq_3$) was vacuum-deposited at a film forming rate of 0.1 to 0.3 nm/sec to form a 60 nm thick emitter layer. Then, magnesium and silver were codeposited at a ratio of 10:1 to form a cathode made of a Mg—Ag layer having a thickness of 200 nm, thus producing organic electroluminescent devices (3) to (7).

Example 8

Production of Organic Electroluminescent Device (8)

A glass transparent support comprising an ITO layer having a surface resistance value of 10 Ω/□ formed on the surface was dipped in a 5 mmol/L methanol solution of 3-aminopropyltrimethoxysilane at 50° C. for 3 hours, ultrasonically cleaned in methanol, and then heated in a constant-temperature bath at 100° C. under reduced pressure (0.01 Pa or less) for one hour (step (I)).

The transparent support was cleaned by dipping in a 1 mmol (repeating unit)/L 2-butanone solution of the copolymer (b1) obtained in Synthesis Example 1 at room temperature for 30 minutes and repeatedly dipping in 2-butanone and was then blow-dried using nitrogen gas (step (II)).

Subsequently, the transparent support was cleaned by dipping in a 25 mmol/L toluene solution of ethylenediamine at room temperature for 30 minutes and repeatedly dipping in toluene and was then blow-dried using nitrogen gas (step III).

Furthermore, the operations of the steps (II) and (III) were repeated 4 times and then the transparent support was heated in a constant-temperature bath at 180° C. under reduced pressure (0.01 Pa or less) for 6 hours to produce a hole transport layer (8) composed of a multi-layered thin film containing the copolymer (b1) as a constituent element. It was confirmed by the measurement of the IR characteristic absorption spectrum of the resulting hole transport layer (8) that it has C=O stretching vibration, an imide bond and an amide bond. The film thickness of the hole transport layer (8) and the root-mean-square surface roughness of the surface were measured in the same manner as in Example 1. The obtained measurement results are shown in Table 3.

On the transparent support comprising the anode and the hole transport layer (8) obtained by the method described above, N,N-diphenyl-N,N'-di(m-tolyl)-benzidine (TPD) was vacuum-deposited at a film forming rate of 0.1 to 0.3 nm/sec to form a 60 nm thick hole transport layer. Then, $Alq_3$ was vacuum-deposited thereon at a film forming rate of 0.1 to 0.3 nm/sec to form a 60 nm thick emitter layer. Furthermore, magnesium and silver were codeposited at a ratio of 10:1 to form a cathode made of a Mg—Ag layer having a thickness of 200 nm, thus producing an organic electroluminescent device (8).

Example 9

Production of Organic Electroluminescent Device (9)

In the same manner as in Example 8, except that the copolymer (b5) obtained in Synthesis Example 5 was used in place of the copolymer (b1) obtained in Synthesis Example 1, a hole transport layer (9) composed of a multi-layered thin film containing the copolymer (b5) as a constituent element was produced. It was confirmed by the measurement of the IR characteristic absorption spectrum of the resulting hole transport layer (9) that it has C=O stretching vibration, an imide bond and an amide bond. The film thickness of the hole transport layer (9) and the root-mean-square surface roughness of the surface were measured in the same manner as in Example 1. The obtained measurement results are shown in Table 3.

On the transparent support comprising the anode and the hole transport layer (9) obtained by the method described above, TPD was vacuum-deposited at a film forming rate of 0.1 to 0.3 nm/sec to form a 60 nm thick hole transport layer. Then, $Alq_3$ was vacuum-deposited thereon at a film forming rate of 0.1 to 0.3 nm/sec to form a 60 nm thick emitter layer. Furthermore, magnesium and silver were codeposited at a ratio of 10:1 to form a cathode made of a Mg—Ag layer having a thickness of 200 nm, thus producing an organic electroluminescent device (9).

Example 10

Production of Organic Electroluminescent Device (10)

A glass transparent support comprising an ITO layer having a surface resistance value of 10 Ω/□ formed on the surface was dipped in a 5 mmol/L methanol solution of 3-aminopropyltrimethoxysilane at 50° C. for 3 hours, ultrasonically cleaned in methanol, and then heated in a constant-temperature bath at 100° C. under reduced pressure (0.01 Pa or less) for one hour (step (I)).

The transparent support was cleaned by dipping in a 1 mmol (repeating unit)/L 2-butanone solution of the copolymer (b10) obtained in Synthesis Example 10 at room temperature for 30 minutes and repeatedly dipping in 2-butanone and was then blow-dried using nitrogen gas (step (II)).

Subsequently, the transparent support was cleaned by dipping in a 25 mmol/L toluene solution of ethylenediamine at room temperature for 30 minutes and repeatedly dipping in toluene and was then blow-dried using nitrogen gas (step III).

After repeating the operations of the steps (II) and (III) 5 times, the transparent support was dipped in a 1 mmol (repeating unit)/L) 2-butanone solution of the copolymer (b5) obtained in Synthesis Example 5 at room temperature for 30 minutes, cleaned by repeatedly dipping in 2-butanone, and then blow-dried using nitrogen gas (step (II)').

Subsequently, the transparent support was cleaned by dipping in a 25 mmol/L toluene solution of ethylenediamine at room temperature for 30 minutes and repeatedly dipping in toluene and was then blow-dried using nitrogen gas (step (III)').

After repeating the operations of the steps (II)' and (III)' 5 times, the transparent support was dipped in a 1 mmol (repeating unit)/L) 2-butanone solution of the copolymer (b11) obtained in Synthesis Example 11 at room temperature for 30 minutes, cleaned by repeatedly dipping in 2-butanone, and then blow-dried using nitrogen gas (step (II)").

Subsequently, the transparent support was cleaned by dipping in a 25 mmol/L toluene solution of ethylenediamine at room temperature for 30 minutes and repeatedly dipping in toluene and was then blow-dried using nitrogen gas (step (III)").

After repeating the operations of the steps (II)" and (III)" 5 times, the transparent support was heated in a constant-temperature bath at 180° C. under reduced pressure (0.01 Pa or less) for 6 hours to produce a hole transport layer (10) composed of a multi-layered thin film containing the copolymers (b10), (b5) and (b11) as a constituent element. It was confirmed by the measurement of the IR characteristic absorption spectrum of the resulting hole transport layer (10) that it has C=O stretching vibration, an imide bond and an amide bond. The film thickness of the hole transport layer (10) and the root-mean-square surface roughness of the surface were measured in the same manner as in Example 1. The obtained measurement results are shown in Table 3.

On the transparent support comprising the anode and the hole transport layer (10) obtained by the method described above, Alq$_3$ was vacuum-deposited at a film forming rate of 0.1 to 0.3 nm/sec to form a 60 nm thick emitter layer. Then, magnesium and silver were codeposited at a ratio of 10:1 to form a cathode made of a Mg—Ag layer having a thickness of 200 nm, thus producing an organic electroluminescent device (10).

Example 11

Production of Organic Electroluminescent Device (11)

In the same manner as in Example 10, each of the steps (I), (II), (III), (II)', (III)', (II)" and (III)" was conducted one time and layers made of the copolymers (b10), (b5) and (b11) were laminated Aon the transparent support. Subsequently, the transparent support was heated in a constant-temperature bath at 180° C. under reduced pressure (0.01 Pa or less) for 6 hours to produce a hole transport layer (11) composed of a multi-layered thin film containing copolymers (b10), (b5) and (b11) as the constituent element. It was confirmed by the measurement of the IR characteristic absorption spectrum of the resulting hole transport layer (11) that it has C=O stretching vibration, an imide bond and an amide bond. The film thickness of the hole transport layer (11) and the root-mean-square surface roughness of the surface were measured in the same manner as in Example 1. The obtained measurement results are shown in Table 3.

On the transparent support comprising the anode and the hole transport layer (11) obtained by the method described above, TPD was vacuum-deposited at a film forming rate of 0.1 to 0.3 nm/sec to form a 60 nm thick hole transferring layer. Then, Alq$_3$ was vacuum-deposited at a film forming rate of 0.1 to 0.3 nm/sec to form a 60 nm thick emitter layer. Furthermore, magnesium and silver were codeposited at a ratio of 10:1 to form a cathode made of a Mg—Ag layer having a thickness of 200 nm, thus producing an organic electroluminescent device (11).

TABLE 3

Film thickness of hole transport layer and root-mean-square surface roughness of surface

| | Film thickness (nm) | Root-mean-square surface roughness (nm) |
| --- | --- | --- |
| Hole transport layer (1) | 44 | 1.5 |
| Hole transport layer (2) | 37.8 | 0.92 |
| Hole transport layer (3) | 45.2 | 1.6 |
| Hole transport layer (4) | 43.2 | 1.5 |
| Hole transport layer (5) | 44.6 | 1.6 |
| Hole transport layer (6) | 44.5 | 1.6 |
| Hole transport layer (7) | 45 | 1.5 |
| Hole transport layer (8) | 8.5 | 0.38 |
| Hole transport layer (9) | 9.5 | 0.44 |
| Hole transport layer (10) | 45.2 | 1.6 |
| Hole transport layer (11) | 7.5 | 0.36 |

It was confirmed by the results shown in Table 3 that, in all Examples, thin hole transport layers with smooth surfaces can be obtained.

The current value and the emission luminance were measured upon application of a voltage of 6 V or 8 V between the anode and the cathode of the organic electroluminescent devices (1) to (11) thus obtained. The obtained measurement results are shown in Table 4. All organic electroluminescent devices (1) to (11) emitted green light upon application of a voltage.

Comparative Example 1

Production of Organic Electroluminescent Device (H1)

In accordance with the method described in "Chemistry of Materials", 1999, Vol. 11, p. 399 (which is incorporated herein by reference), a homopolymer of m-tolyl(p-vinylphenyl)phenylamine was synthesized. The resulting homopolymer was subjected to gel permeation chromatography analysis. As a result, Mw, Mn and Mw/Mn (relative to polystyrene standards) were respectively 10000, 8300 and 1.2.

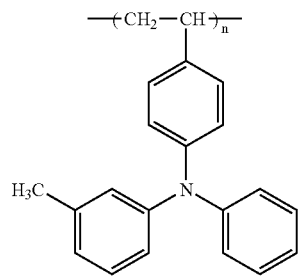

In the same manner as in Example 1, except that a glass transparent support comprising an indium tin oxide ITO layer having a surface resistance value of 10 Ω/□ formed thereon was brought into contact with 3-aminopropyltrimethoxysilane and then a spin-coated thin film (film thickness: 60 nm) made of an m-tolyl(p-vinylphenyl)phenylamine homopolymer was produced in place of the multi-layered thin film made of the copolymer (b1), an organic electroluminescent device (H1) was produced. The current value and the emission luminance were measured upon application of a voltage of 6 V or 8 V between the anode and the cathode of the resulting organic electroluminescent device (H1). The obtained measurement results are shown in Table 4. The organic electroluminescent device (H1) emitted green light upon application of a voltage.

Comparative Example 2

Production of Organic Electroluminescent Device (H2)

In accordance with the method described in "Chemistry of Materials", 1999, Vol. 11, p. 399 (which is incorporated herein by reference), a homopolymer of 4-(m-tolylphenylamino)-4'-(m-tolyl-p-vinylphenylamino)biphenyl was synthesized. The resulting homopolymer was subjected to gel permeation chromatography analysis. As a result, Mw, Mn and Mw/Mn (relative to polystyrene standards) were respectively 12000, 10400 and 1.15.

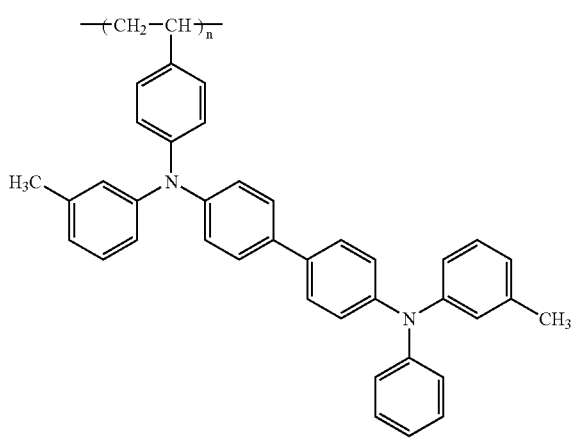

In the same manner as in Example 6, except that a glass transparent support comprising an indium tin oxide ITO layer having a surface resistance value of 10 Ω/□ formed thereon was brought into contact with 3-aminopropyltrimethoxysilane and then a spin-coated thin film (film thickness: 60 nm) made of a 4-(m-tolylphenylamino)-4'-(m-tolyl-p-vinylphenylamino)biphenyl homopolymer was produced in place of the multi-layered thin film made of the copolymer (b7), an organic electroluminescent device (H2) was produced. The current value and the emission luminance were measured upon application of a voltage of 6 V or 8 V between the anode and the cathode of the resulting organic electroluminescent device (H2). The obtained measurement results are shown in Table 4. The organic electroluminescent device (H2) emitted green light upon application of a voltage.

TABLE 4

| | Current value upon application of voltage and emission luminance | | | |
|---|---|---|---|---|
| | Applied voltage 6 V | | Applied voltage 8 V | |
| | Current value (mA/cm$^2$) | Emission luminance (cd/m$^2$) | Current value (mA/cm$^2$) | Emission luminance (cd/m$^2$) |
| Example 1 | 6.5 | 100 | 25 | 500 |
| Example 2 | 6.6 | 105 | 24 | 500 |
| Example 3 | 7.5 | 120 | 30 | 560 |
| Example 4 | 7.5 | 125 | 30 | 580 |
| Example 5 | 7.8 | 125 | 30 | 580 |
| Example 6 | 7.2 | 120 | 28 | 550 |
| Example 7 | 7.4 | 125 | 29 | 570 |
| Example 8 | 7.5 | 125 | 30 | 570 |
| Example 9 | 7.4 | 125 | 28 | 560 |
| Example 10 | 8.5 | 140 | 35 | 650 |
| Example 11 | 8.4 | 135 | 34 | 630 |
| Comparative Example 1 | 4.5 | 60 | 20 | 400 |
| Comparative Example 2 | 5 | 70 | 20 | 400 |

As is apparent from the results shown in Table 4, all organic electroluminescent devices (1) to (11) produced in Examples 1 to 11 have high luminance as compared with organic electroluminescent devices (H1) to (H2) produced in Comparative Examples 1 to 2, and are excellent in light emission characteristics. Also, the organic electroluminescent device (10) comprising a hole transport layer, constituent layers being provided in the order of increase in ionization potential from the anode, exhibits excellent light emission characteristics as compared with the devices obtained in Examples 1 to 7 and the device (11) exhibits excellent light emission characteristics as compared with the devices obtained in Examples 8 and 9.

What is claimed is:
1. A diarylamino group-containing copolymer comprising a molecular chain represented by the formula (1):

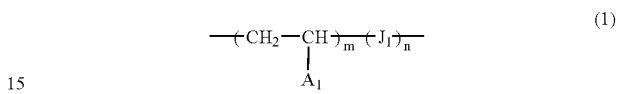

and molecular chain terminals which are each independently a radical polymerization initiator residue or a hydrogen atom, the copolymer having a degree of polymerization of 3 to 500, wherein, in the formula (1), $A_1$ represents a group represented by the formula (2) or (3):

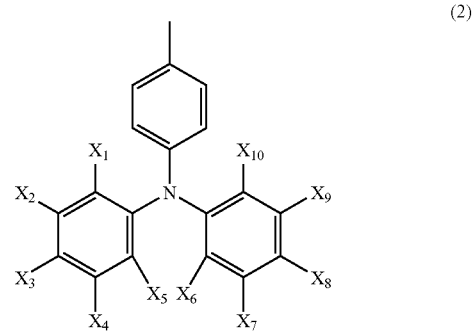

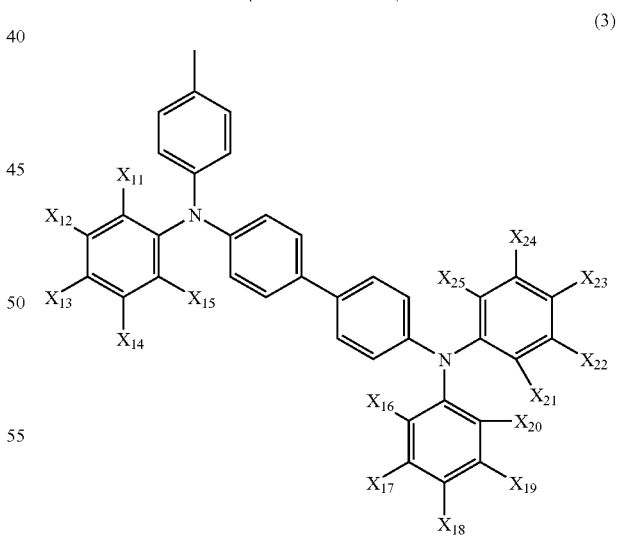

and in the formulas (2) and (3), $X_1$ to $X_{25}$ each independently represents a hydrogen atom, a halogen atom, a $C_1$ to $C_{22}$ alkyl group, a $C_1$ to $C_{22}$ alkylthio group, a $C_1$ to $C_{22}$ alkoxy group which may be substituted with a halogen atom, an N,N-dialkylamino group in which each alkyl group is a $C_1$ to $C_{22}$ alkyl group, a phenyl group, or an N,N-diphenylamino group, $J_1$ represents a repeating unit represented by any of the formulas (4) to (7):

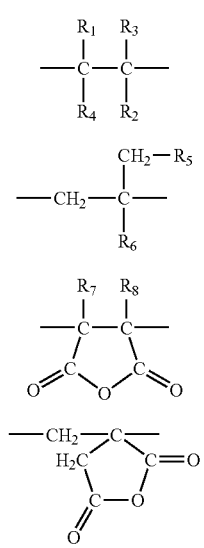

and in the formulas (4) to (7), $R_1$ to $R_6$ each independently represents a hydrogen atom, a $C_1$ to $C_4$ alkyl group, a carboxyl group, or an alkyloxycarbonyl group in which the alkyl group is a $C_1$ to $C_{22}$ alkyl group, $R_7$ and $R_8$ each independently represents a hydrogen atom or a $C_1$ to $C_4$ alkyl group, with the proviso that at least two of $R_1$ to $R_4$ represent a carboxyl group and at least one of $R_5$ and $R_6$ represents a carboxyl group, and m and n represent positive numbers.

2. The diarylamino group-containing copolymer according to claim 1, wherein a ratio of m to n, m:n, is from 1:1 to 4:1.

3. The diarylamino group-containing copolymer according to claim 1, wherein the degree of polymerization is within a range of 10 to 200.

4. An organic electroluminescent device comprising an anode, a hole transport layer, an emitter layer and a cathode, which are provided on a transparent support, wherein the hole transport layer comprises a layer made of a diarylamino group-containing copolymer of claim 1.

5. The organic electroluminescent device according to claim 4, wherein a coupling agent having an amino group is bonded with the surface of the anode, and the coupling agent and a layer made of the diarylamino group-containing copolymer are bonded through an amide bond or an imide bond.

6. The organic electroluminescent device according to claim 4, wherein the hole transport layer comprises a layer made of a compound having two or more amino groups per molecule, and a multi-layered structure in which at least one layer made of the diarylamino group-containing copolymer and at least one layer made of a compound having two or more amino groups per molecule are alternately laminated through an amide bond or an imide bond.

7. The organic electroluminescent device according to claim 6, wherein the multi-layered structure comprises two or more layers made of the diarylamino group-containing copolymer, the layers of which are provided in the order of increase in an ionization potential from the anode.

8. A method of producing an organic electroluminescent device which has an anode, a hole transport layer, an emitter layer and a cathode, which are provided on a transparent support, the method comprising the steps of:

(I) bringing a solution containing a coupling agent having a functional group capable of forming covalent bonds with a functional group of the copolymer of claim 1 into contact with the surface of the anode provided on the transparent support to form a layer made of the coupling agent, and (II) bringing a solution containing the copolymer of claim 1 into contact with the surface of the layer made of the coupling agent to form a layer made of the copolymer.

9. The method of producing an organic electroluminescent device according to claim 8, which further comprises the step of heating after each of the steps (I) and (II) or after the step (II).

10. The method of producing an organic electroluminescent device according to claim 8, wherein the functional group of the copolymer is a carboxyl group or an acid anhydride group, and the functional group of the coupling agent is an amino group.

11. The method of producing an organic electroluminescent device according to claim 8, which further comprises the following step of:

(III) bringing a solution containing a compound having two or more functional groups capable of forming covalent bonds with a functional group of the copolymer into contact with the surface of a layer made of the copolymer to from a layer made of the compound, after the step (II).

12. The method of producing an organic electroluminescent device according to claim 11, which further comprises the step of heating after the step (III).

13. The method of producing an organic electroluminescent device according to claim 11, wherein the functional group of the compound having two or more functional groups capable of forming covalent bonds with a functional group of the copolymer is an amino group.

14. A method of producing an organic electroluminescent device in an organic electroluminescent device comprising an anode, a hole transport layer, an emitter layer and a cathode, which are provided on a transparent support, the method comprising the steps of:

(i) bringing a solution containing a coupling agent having a functional group capable of forming covalent bonds with a functional group of the copolymer of claim 1 into contact with the surface of the anode provided on the transparent support to form a layer made of the coupling agent, (ii) bringing a solution containing the copolymer of claim 1 into contact with the surface of the layer made of the coupling agent to form a layer made of the copolymer, (iii) bringing a solution containing a compound having two or more functional groups capable of forming covalent bonds with a functional group of the copolymer of claim 1 into contact with the surface of the layer made of the copolymer to form a layer made of the compound, and (iv) alternately laminating at least one layer made of the copolymer of claim 1 and at least one layer made of a compound having two or more functional groups capable of forming covalent bonds with a functional group of the copolymer, in this order, after the step (iii).

15. The method of producing an organic electroluminescent device according to claim 14, which further comprises the step of heating after each of the steps (i) to (iv) or after any step.

16. The method of producing an organic electroluminescent device according to claim 14, wherein the copolymer has a functional group that is a carboxyl group or an acid anhydride group, and the functional groups of both the coupling agent and the compound having two or more functional groups capable of forming covalent bonds with a functional group of the copolymer are amino groups.

17. An organic electroluminescent device comprising an anode, a hole transport layer, an emitter layer and a cathode, which are provided on a transparent support, wherein the hole transport layer comprises a layer made of a diarylamino group-containing copolymer comprising a molecular chain represented by the formula (1):

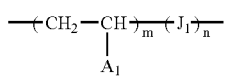

(1)

and molecular chain terminals which are each independently a radical polymerization initiator residue or a hydrogen atom, the copolymer having a degree of polymerization of 3 to 500, wherein, in the formula (1), $A_1$ represents a group represented by the formula (2) or (3):

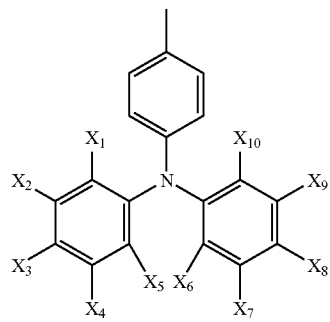

(2)

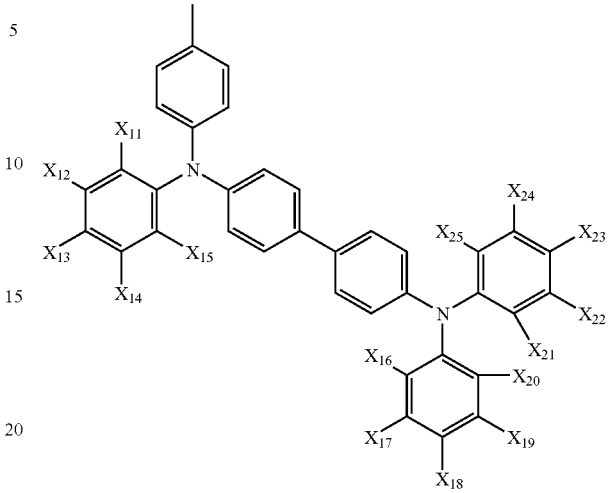

(3)

and in the formulas (2) and (3), $X_1$ to $X_{25}$ each independently represents a hydrogen atom, a halogen atom, a $C_1$ to $C_{22}$ alkyl group, a $C_1$ to $C_{22}$ alkylthio group, a $C_1$ to $C_{22}$ alkoxy group which may be substituted with a halogen atom, an N,N-dialkylamino group in which each alkyl group is a $C_1$ to $C_{22}$ alkyl group, a phenyl group, or an N,N-diphenylamino group, $J_1$ represents a repeating unit represented by any of the formulas (4) to (7):

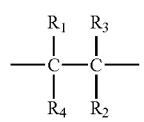

(4)

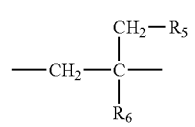

(5)

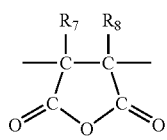

(6)

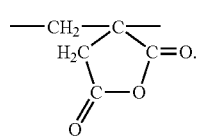

(7)

and in the formulas (4) to (7), $R_1$ to $R_6$ each independently represents a hydrogen atom, a $C_1$ to $C_4$ alkyl group, a carboxyl group, or an alkyloxycarbonyl group in which the alkyl group is a $C_1$ to $C_{22}$ alkyl group, $R_7$ and $R_8$ each independently represents a hydrogen atom or a $C_1$ to $C_4$ alkyl group, with the proviso that at least two of $R_1$ to $R_4$ represent a carboxyl group and at least one of $R_5$ and $R_6$ represents a carboxyl group, and m and n represent positive numbers.

18. An organic electroluminescent device comprising an anode, a hole transport layer, an emitter layer and a cathode, which are provided on a transparent support, wherein the hole transport layer comprises a layer made of a copolymer represented by following formula (8):

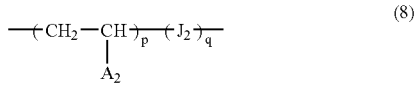

(8)

and in the formula (8), $A_2$ represents a group selected from the group consisting of an N,N-diaryl-substituted amino group, a group having an N,N-diaryl-substituted amino moiety, a trialkylamino group, a pyrazoline-containing group, a stilbene-containing group, a hydrazone-containing group, an oxadiazole-containing group, a phthalocyanine-containing group, a naphthalocyanine-containing group, a porphyrin-containing group and a $C_{60}$-containing group, $J_2$ represents a polymerizable unsaturated monomer unit having at least one functional group, and p and q represent positive numbers, wherein a coupling agent having a group capable of forming covalent bonds with a functional group of a copolymer represented by the formula (8) is fixed on the anode surface, and the anode and a layer made of the copolymer represented by the formula (8) are bonded by covalent bonds via the coupling agent.

19. An organic electroluminescent device comprising an anode, a hole transport layer, an emitter layer and a cathode, which are provided on a transparent support, wherein the hole transport layer comprises a layer made of a copolymer represented by following formula (8):

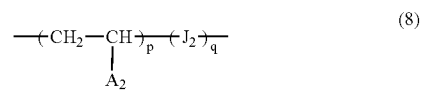

(8)

and in the formula (8), $A_2$ represents a group selected from the group consisting of an N,N-diaryl-substituted amino group, a group having an N,N-diaryl-substituted amino moiety, a trialkylamino group, a pyrazoline-containing group, a stilbene-containing group, a hydrazone-containing group, an oxadiazole-containing group, a phthalocyanine-containing group, a naphthalocyanine-containing group, a porphyrin-containing group and a $C_{60}$-containing group, $J_2$ represents a polymerizable unsaturated monomer unit having at least one functional group, and p and q represent positive numbers, wherein the hole transport layer has a multi-layered structure in which at least one layer made of the copolymer represented by the formula (8) and at least one layer made of a compound having two or more groups per molecule which are capable of forming covalent bonds with a functional group of the copolymer layer are alternately laminated via covalent bonds.

20. The organic electroluminescent device according to claim 19, wherein the group capable of forming covalent bonds with a functional group of the copolymer represented by the formula (8) is at least one selected from an amino group, an isocyanate group and a hydroxyl group.

21. The organic electroluminescent device according to claim 19, comprising two or more layers made of the copolymer represented by the formula (8), the copolymer layers of which are provided in the order of increase in an ionization potential from the anode.

* * * * *